United States Patent
Hurwitz

(10) Patent No.: US 11,315,725 B2
(45) Date of Patent: Apr. 26, 2022

(54) CURRENT SENSING COIL ELECTROSTATIC SHIELDING

(71) Applicant: Analog Devices International Unlimited Company, Limerick (IE)

(72) Inventor: Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 434 days.

(21) Appl. No.: 16/661,376

(22) Filed: Oct. 23, 2019

(65) Prior Publication Data

US 2020/0141981 A1 May 7, 2020

Related U.S. Application Data

(60) Provisional application No. 62/754,825, filed on Nov. 2, 2018.

(51) Int. Cl.
*G01R 15/18* (2006.01)
*H01F 27/36* (2006.01)
(Continued)

(52) U.S. Cl.
CPC .......... *H01F 27/363* (2020.08); *G01R 1/18* (2013.01); *G01R 1/22* (2013.01); *G01R 15/18* (2013.01);
(Continued)

(58) Field of Classification Search
CPC .... H01F 27/363; H01F 27/288; H01F 27/361; H01F 27/2885; H01F 27/36;
(Continued)

(56) References Cited

U.S. PATENT DOCUMENTS

| 3,961,318 A | 6/1976 | Farrand et al. |
| 6,184,672 B1 | 2/2001 | Berkcan |

(Continued)

FOREIGN PATENT DOCUMENTS

| CN | 100565222 | 12/2009 |
| CN | 101625377 | 1/2010 |

(Continued)

OTHER PUBLICATIONS

"Chinese Application Serial No. 201911059483.1, Office Action dated Sep. 10, 2021", w/ English Translation, 11 pgs.

(Continued)

*Primary Examiner* — Raul J Rios Russo
(74) *Attorney, Agent, or Firm* — Schwegman Lundberg & Woessner, P.A.

(57) ABSTRACT

The present disclosure relates to an electrostatic shield for providing electrostatic shielding for a current sensing coil. Current sensing coils are configured to enable the measurement of a current carried by an electrical conductor passing through a core of the current sensing coil. The electrostatic shield of the present disclosure is configured to provide electrostatic shielding to a core of the current sensing coil in order to reduce or eliminate electrostatic coupling between the electrical conductor and the current sensing coil, thereby improving the accuracy of current measurement that may be achieved by the current sensing coil.

21 Claims, 13 Drawing Sheets

(51) Int. Cl.
  *G01R 1/18* (2006.01)
  *H01F 27/28* (2006.01)
  *H05K 1/02* (2006.01)
  *H05K 9/00* (2006.01)
  *H05K 1/18* (2006.01)
  *G01R 1/22* (2006.01)
  *G01R 15/20* (2006.01)
  *G01R 19/00* (2006.01)

(52) U.S. Cl.
  CPC ......... *G01R 15/181* (2013.01); *G01R 15/183* (2013.01); *G01R 15/185* (2013.01); *G01R 15/186* (2013.01); *G01R 15/202* (2013.01); *H01F 27/288* (2013.01); *H01F 27/361* (2020.08); *H05K 1/0263* (2013.01); *H05K 1/181* (2013.01); *H05K 9/0079* (2013.01); *G01R 19/0092* (2013.01); *H05K 2201/10151* (2013.01)

(58) Field of Classification Search
  CPC ..... H01F 27/2804; G01R 1/18; G01R 15/181; G01R 1/22; G01R 15/183; G01R 15/185; G01R 15/18; G01R 15/186; G01R 15/202; G01R 19/0092; H05K 1/0263; H05K 1/181; H05K 9/0079; H05K 2201/10151; H05K 2201/09063; H05K 1/165
  USPC .... 324/72, 76.11–76.83, 115, 126, 127, 129, 324/149
  See application file for complete search history.

(56) References Cited

U.S. PATENT DOCUMENTS

| | | |
|---|---|---|
| 8,179,122 B2 | 5/2012 | Ibuki |
| 8,841,900 B2 | 9/2014 | Javora et al. |
| 9,285,398 B2 | 3/2016 | Lu |
| 9,671,434 B2 | 6/2017 | Bietz et al. |
| 9,846,179 B2 | 12/2017 | Claeys |
| 2007/0167723 A1 | 7/2007 | Park et al. |
| 2008/0048646 A1 | 2/2008 | Wilkerson et al. |
| 2008/0258739 A1* | 10/2008 | Niwa ................... G01D 5/2013 324/654 |
| 2008/0315868 A1* | 12/2008 | Niwa ....................... G01D 3/02 324/207.16 |
| 2009/0115399 A1 | 5/2009 | Sorensen |
| 2016/0154026 A1* | 6/2016 | Claeys ................. H01F 27/363 324/127 |
| 2017/0356934 A1 | 12/2017 | Hurwitz et al. |
| 2018/0040417 A1 | 2/2018 | Krupezevic et al. |
| 2018/0052191 A1 | 2/2018 | Kern |
| 2018/0166212 A1 | 6/2018 | Pauley et al. |

FOREIGN PATENT DOCUMENTS

| | | |
|---|---|---|
| CN | 102066954 | 5/2011 |
| CN | 104251715 | 12/2014 |
| CN | 105372473 | 3/2016 |
| CN | 205159081 | 4/2016 |
| CN | 105652066 | 6/2016 |
| CN | 206251571 | 6/2017 |
| CN | 206311657 | 7/2017 |
| CN | 107689651 | 2/2018 |
| JP | 2002231535 | 8/2002 |
| JP | 2010008120 | 1/2010 |
| TW | I335443 | 1/2011 |

OTHER PUBLICATIONS

"Chinese Application Serial No. 201911059483.1, Response filed Nov. 16, 2021 to Office Action dated Sep. 10, 2021", w/English Claims, 37 pgs.

"Taiwanese Application Serial No. 108139687, Office Action dated Dec. 8, 2020", w/ English Machine Translation, 8 pgs.

* cited by examiner

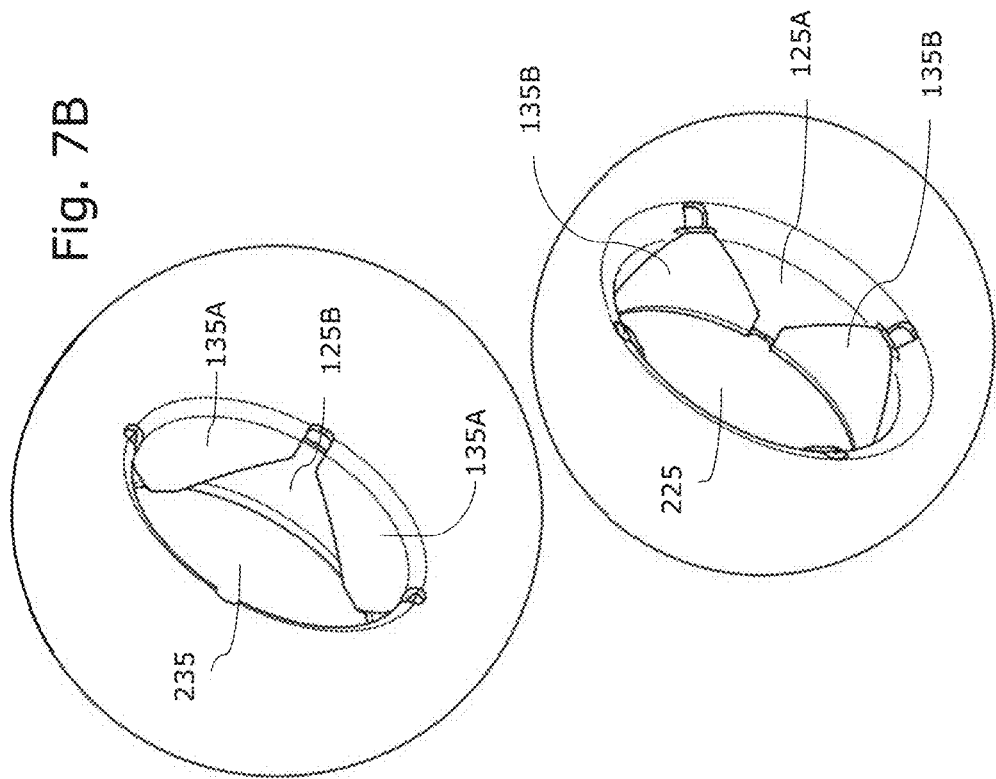
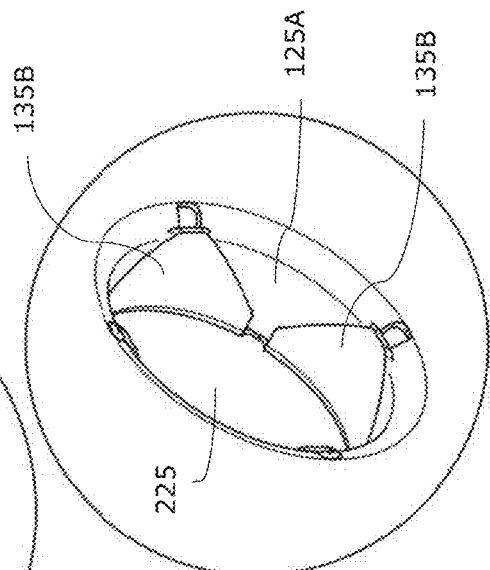
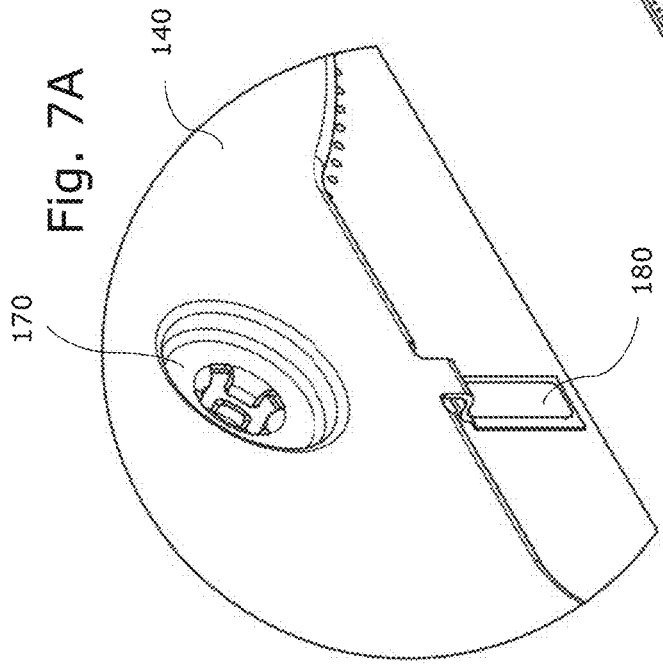
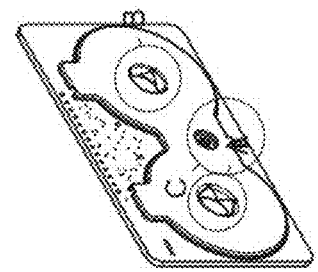

CURRENT SENSING COIL ELECTROSTATIC SHIELDING

CLAIM OF PRIORITY

This application claims the benefit of priority to U.S. Provisional Patent Application Ser. No. 62/754,825, filed Nov. 2, 2018, which is hereby incorporated by references herein in its entirety.

BACKGROUND

Di/dt current sensing coils, for example Rogowski coils, are electrical devices comprising a coil of wire, such as a helical coil, that is wrapped around a central opening arranged to receive a current carrying conductor. In this way, the coil of wire completely, or substantially, surrounds the central opening. Voltage induced in the current sensing coil is proportional to the rate of change of the alternating current in the current carrying wire. Therefore, the alternating current in the current carrying wire may be measured based on the voltage induced in the current sensing coil, for example by integrating the induced voltage.

For many different applications, a high level of current measurement accuracy may be important. Therefore, the present disclosure is concerned with improving the level of current measuring accuracy that can be achieved using current sensing coils.

SUMMARY

The present disclosure relates to an electrostatic shield for providing electrostatic shielding for a current sensing coil. Current sensing coils are configured to enable the measurement of a current carried by an electrical conductor passing through a core of the current sensing coil. The electrostatic shield of the present disclosure is configured to provide electrostatic shielding to a core of the current sensing coil in order to reduce or eliminate electrostatic coupling between the electrical conductor and the current sensing coil, thereby improving the accuracy of current measurement that may be achieved by the current sensing coil.

In a first aspect of the disclosure, there is provided an electrostatic shield for use with a current sensing coil, the current sensing coil having a primary plane and a substantially central opening arranged to receive a current carrying conductor through the opening and through the primary plane, the electrostatic shield comprising: a first shield body for mounting over a first side of the current sensing coil, the first shield body comprising: a first primary shield portion configured to extend substantially in a direction of the primary plane of the current sensing coil when the first shield body is mounted over the first side of the current sensing coil; and a first core shield portion extending transversely to the first primary shield portion and configured to extend at least partially through the central opening of the current sensing coil from a first side of the current sensing coil when the first shield body is mounted over the first side of the current sensing coil; and a second shield body for mounting over a second side of the current sensing coil, the second shield body comprising: a second primary shield portion configured to extend substantially in a direction of the primary plane of the current sensing coil when the second shield body is mounted over the second side of the current sensing coil; and a second core shield portion extending transversely to the second primary shield portion and configured to extend at least partially through the central opening of the current sensing coil from a second side of the current sensing coil when the second shield body is mounted over the second side of the current sensing coil, wherein the first core shield portion and second core shield portion together define a core shield extending into the central opening of the current sensing coil to shield at least a part of the current sensing coil from electrostatic coupling when the first shield body is mounted over the first side of the current sensing coil and the second shield body is mounted over the second side of the current sensing coil.

The first and second core shield portions may be sized to at least partially overlap when the first shield body is mounted over the first side of the current sensing coil and the second shield body is mounted over the second side of the current sensing coil.

The first core shield portion may comprise a plurality of first core projections, and wherein the second core shield portion comprises a plurality of second core projections.

The plurality of first core projections may be arranged in a first array and the plurality of second core projections are arranged in a second array, wherein the first and second arrays correspond to the shape of the substantially central opening of the current sensing coil with a gap between adjacent core projections.

The arrays of the first and second core shield portions may be arranged such that, when the first shield body is mounted over the first side of the current sensing coil and the second shield body is mounted over the second side of the current sensing coil, the gaps between adjacent core projections in the first array of the first core shield portion are at least partially aligned with the core projections of the second array of the second core shield portion, and the gaps between adjacent second core projections in the second array of the second core shield portion are at least partially aligned with the first core projections of the first array of the first core shield portion.

A diameter of the first array of first core projections may be smaller than a diameter of the second array of second core projections.

At least part of the first core projections may overlap with at least part of the second core projections.

The electrostatic shield may be further configured for use with a further current sensing coil, the further current sensing coil having the same primary plane as the current sensing coil and a further substantially central opening arranged to receive a further current carrying conductor through the further substantially central opening and through the primary plane, wherein the first shield body further comprises a first further core shield portion extending transversely to the first primary shield portion and configured to extend at least partially through the further substantially central opening of the further current sensing coil from a first side of the further current sensing coil when the first shield body is mounted over the first side of the current sensing coil, wherein the second shield body further comprises a second further core shield portion extending transversely to the second primary shield portion and configured to extend at least partially through the further substantially central opening of the further current sensing coil from a second side of the further current sensing coil when the second shield body is mounted over the second side of the current sensing coil, and wherein the first further core shield portion and second further core shield portion together define a further core shield extending into the central opening of the further current sensing coil to shield at least a part of the further current sensing coil from electrostatic coupling when the first shield body is mounted over the first side of the current sensing coil and the second shield body is mounted over the second side of the current sensing coil.

A diameter of the first core shield portion may be smaller than a diameter of the first further core shield portion a diameter of the second core shield portion may be smaller than a diameter of the second further core shield portion.

In a second aspect of the present disclosure, there is provided a shielded current sensing device assembly comprising: a current sensing device comprising a board having a first board surface and an opposing second board surface, an opening in the board for receiving a current carrying conductor through the board, and a current sensing coil formed on the board and arranged around at least part of the opening; and an electrostatic shield comprising: a first shield body mounted on the first board surface and comprising: a first primary shield portion extending substantially in a direction of the first surface of the current sensing coil to provide electrostatic shielding to the current sensing coil at the first board surface; and a first core shield portion extending transversely to the first primary shield portion and extending at least partially through the opening from a first side of the current sensing coil; and a second shield body mounted on the second board surface and comprising: a second primary shield portion extending substantially in a direction of the second surface of the current sensing coil to provide electrostatic shielding to the current sensing coil at the second board surface; and a second core shield portion extending transversely to the second primary shield portion and extending at least partially through the opening from a second side of the current sensing coil; wherein the first core shield portion and second core shield portion together define a core shield extending into the opening to shield at least a part of the current sensing coil from electrostatic coupling.

The board may be a printed circuit board.

In a third aspect of the present disclosure, there is provided an electrostatic shield for use with a current sensing coil, the current sensing coil having a primary plane and a substantially central opening arranged to receive a current carrying conductor through the opening and through the primary plane, the electrostatic shield comprising: a shield body comprising: a primary shield portion configured to extend substantially in a direction of the primary plane of the current sensing coil when the shield body is in use; and a core shield portion configured to extend at least partially through the central opening of the current sensing coil to shield at least a part of the current sensing coil from electrostatic coupling when the shield body is in use, wherein the core shield portion comprises a plurality of core projections extending transversely to the primary shield portion, and wherein each of the plurality of core projections is formed from a bent portion of the primary shield portion.

Each of the core projections may comprise a base connection to the primary shield portion and a tip distal from the base, wherein the tip is narrower than the base connection.

The primary shield body and the plurality of core projections of the core shield portion may be formed from a single sheet of material.

The primary shield portion may have a primary plane arranged to extend substantially in a direction of the primary plane of the current sensing coil.

The plurality of core projections may be arranged in an array corresponding to a shape of the substantially central opening of the current sensing coil.

The array may have a substantially circular or cylindrical shape.

The plurality of core projections may be arranged in an array so as to provide a gap between adjacent core projections in the array.

At least some of the surfaces of the shield body may be metallic.

The shield body may comprise a nickel coating.

ASPECTS OF THE DISCLOSURE

Some non-limiting aspects of the disclosure are listed in the following numbered clauses:

1. An electrostatic shield for use with a current sensing coil, the current sensing coil having a primary plane and a substantially central opening arranged to receive a current carrying conductor through the opening and through the primary plane, the electrostatic shield comprising:
a shield body comprising a core shield portion, the core shield portion being configured to extend, when in use, at least partially through the central opening of the current sensing coil to shield at least a part of the current sensing coil from electrostatic coupling.

2. The electrostatic shield of aspect 1, wherein the core shield portion is arranged to shield at least part of the inner periphery of the current sensing coil.

3. The electrostatic shield of any preceding aspect, wherein the core shield portion is configured to extend between the current sensing coil and the current carrying conductor when the current carrying conductor is arranged to pass through the opening, so as to shield at least a part of the current sensing coil from electrostatic coupling with the current carrying conductor.

4. The electrostatic shield of any preceding aspect, wherein the shield body further comprises a primary shield portion having a primary plane arranged to extend substantially in a direction of the primary plane of the current sensing coil.

5. The electrostatic shield of aspect 4, wherein the core shield portion comprises at least one core projection extending away from the primary plane of the primary shield portion.

6. The electrostatic shield of aspect 5, wherein the core shield portion comprises a plurality of core projections extending in a common direction away from the primary plane of the primary shield portion.

7. The electrostatic shield of aspect 6, wherein the plurality of core projections are arranged in an array corresponding to the shape of the substantially central opening of the current sensing coil.

8. The electrostatic shield of aspect 7, wherein the array has a substantially circular or cylindrical shape.

9. The electrostatic shield of any of aspects 6 to 8, wherein the plurality of core projections are arranged in an array so as to provide a gap between adjacent core projections in the array.

10. The electrostatic shield of aspect 9, wherein each of the core projections comprise a base connection to the primary shield portion and a tip distal from the base, wherein the tip is narrower than the base connection.

11. The electrostatic shield of any of aspects 5 to 10, wherein the at least one core projection is formed by metal extrusion.

12. The electrostatic shield of any of aspects aspect 4 to 11, wherein the shield body further comprises an outer wall, projecting away from the primary plane of the primary shield portion.

13. The electrostatic shield of any preceding aspect, wherein the current sensing coil is a board mounted current sensing coil and the primary plane of the current sensing coil is the primary plane of the board.

14. The electrostatic shield of aspect 12, wherein the board is a printed circuit board.

15. The electrostatic shield of aspect 13 or aspect 14, wherein the shield body further comprises a fastening portion for use in mechanically fastening the electrostatic shield to a surface of the board.

16. The electrostatic shield of aspect 15, wherein the fastening portion is for use in fastening the electrostatic shield to the board using a mechanical fastener.

17. The electrostatic shield of aspect 15 or aspect 16, wherein the fastening portion is configured to electrically couple the electrostatic shield to a board voltage terminal when the electrostatic shield is mechanically fastened to the board.

18. The electrostatic shield of any of aspects 12 to 17, further comprising a solder tab for soldering to a board voltage terminal to electrically couple the electrostatic shield to the board voltage terminal.

19. The electrostatic shield of aspect 17 or 18, wherein the board voltage terminal comprises a ground terminal or a neutral terminal or a phase terminal at a voltage other than a voltage of the current carrying conductor.

20. The electrostatic shield of any of aspects 12 to 19, wherein the shield body further comprises a component shield portion for providing electrostatic shielding to one or more board mounted components.

21. The electrostatic shield of any of aspects 12 to 20, wherein the shield body further comprises an outer wall, projecting away from the primary plane of the primary shield portion and configured to engage with a surface of the board when the electrostatic shield is mounted on a surface of the board, such that the primary shield portion and the outer wall would together provide electrostatic shielding to at least part of the surface of the board.

22. The electrostatic shield of any preceding aspect, wherein at least some of the surfaces of the shield body are metallic.

23. The electrostatic shield of aspect 22, wherein the shield body comprises a nickel coating.

24. The electrostatic shield of any preceding aspect, further configured for use with a further current sensing coil, the further current sensing coil having the same primary plane as the current sensing coil and a further substantially central opening arranged to receive a further current carrying conductor through the further substantially central opening and through the primary plane, wherein the shield body further comprises:
   a further core shield portion configured to extend at least partially through the further substantially central opening of the further current sensing coil to shield at least a part of the further current sensing coil from electrostatic coupling.

25. The electrostatic shield of aspect 24, wherein a diameter of the core shield portion is smaller than a diameter of the further core shield portion.

26. The electrostatic shield of aspect 25, configured to form an electrostatic shield assembly in combination with a further identical electrostatic shield, for use in providing electrostatic shielding for the current sensing coil and the further current sensing coil.

27. A current sensing device comprising:
   a board having a first surface and a second surface;
   a current sensing coil formed on the board and around an opening in the board arranged to receive a current carrying conductor through the opening and through a plane of the first surface and a plane of the second surface; and
   a plurality of electrostatic shield vias arranged around at least part of a perimeter of the current sensing coil, wherein each of the plurality of electrostatic shield vias passes through at least part of the board between the first surface and the second surface.

28. The current sensing device of aspect 27, wherein the plurality of electrostatic shield vias are arranged in a single ring around the at least part of the perimeter of the current sensing coil.

29. The current sensing device of aspect 27, wherein the plurality of electrostatic shield vias are arranged in at least two rings around the at least part of the perimeter of the current sensing coil, wherein each of the at least two rings is at a different distance from the perimeter of the current sensing coil.

30. The current sensing device of aspect 29, wherein angular positions of at least some of the electrostatic shield vias in one of the rings relative to a centre of the opening in the board are different to angular positions of the electrostatic shield vias in the other rings relative to the centre of the opening in the board.

31. A shielded current sensing device assembly comprising:
   a current sensing device comprising:
      a board having a first board surface and an opposing second board surface;
      an opening in the board for receiving a current carrying conductor through the board; and
      a current sensing coil formed on the board and arranged around at least part of the opening;
   a first electrostatic shield mounted on the first board surface and comprising:
      a first primary shield portion having a primary plane arranged to extend substantially in a direction of a primary plane of the current sensing coil, for providing electrostatic shielding to the current sensing coil at the first board surface; and
      a first core shield portion extending at least partially through the opening of the board mounted current sensing coil; and
   a second electrostatic shield mounted on the second board surface and comprising:
      a second primary shield portion having a primary plane arranged to extend substantially in a direction of a primary plane of the current sensing coil, for providing electrostatic shielding to the current sensing coil at the second board surface; and
      a second core shield portion extending at least partially through the opening of the board mounted current sensing coil,
   wherein the first core shield portion and second core shield portion together provide electrostatic shielding to the current sensing coil at the opening.

32. The electrostatic shield assembly of aspect 31, wherein
   the first core shield portion comprises a first plurality core projections extending in a common direction away from the primary plane of the first electrostatic shield, wherein the first plurality of core projections are arranged in an array around the opening in the board mounted current sensing coil with a gap between adjacent core projections in the array; and wherein
   the second core shield portion comprises a second plurality core projections extending in a common direction away from the primary plane of the second electrostatic shield, wherein the second plurality of core projections are arranged in an array around the opening in the board mounted current sensing coil with a gap between adjacent core projections in the array; and wherein the gaps between adjacent core projections in the array of first core shield portions aligns at least partially with the second plurality of core projections, and vice-versa.

33. The electrostatic shield assembly of aspect 31 or aspect 32, wherein
a diameter of the array of first core projections is smaller than a diameter of the arrange of second core projections, such that at least part of the first core projections overlap with at least part of the second core projections.

34. A method of manufacturing an electrostatic shield for use with a current sensing coil, the current sensing coil having a primary plane and a substantially central opening arranged to receive a current carrying conductor through the opening and through the primary plane, the electrostatic shield comprising:
forming a shield body comprising a primary shield portion and a core shield portion; and
pressing the core shield portion to extend away from the primary plane of the primary shield portion, such that when the electrostatic shield is used with a current sensing coil and a primary plane of the electrostatic shield substantially aligns with the primary plane of the current sensing coil, the core shield portion would extend at least partially through the central opening of the current sensing coil to shield at least a part of the current sensing coil from electrostatic coupling.

35. A shielded current sensing device assembly comprising:
a current sensing device comprising a current sensing coil having a primary plane and a substantially central opening arranged to receive a current carrying conductor through the opening and through the primary plane;
a first electrostatic shield arranged adjacent a first side of the current sensing coil and comprising:
a first primary shield portion having a primary plane arranged to extend substantially in a direction of a primary plane of the current sensing coil, for providing electrostatic shielding to the current sensing coil; and
a first core shield portion extending at least partially through the substantially central opening of the current sensing coil; and
a second electrostatic shield arranged adjacent a second side of the current sensing coil and comprising:
a second primary shield portion having a primary plane arranged to extend substantially in a direction of a primary plane of the current sensing coil, for providing electrostatic shielding to the current sensing coil; and
a second core shield portion extending at least partially through the substantially central opening of the current sensing coil,
wherein the first core shield portion and second core shield portion together provide electrostatic shielding to the current sensing coil at the opening.

36. A shielded current sensing device assembly comprising:
a current sensing device comprising a current sensing coil having a primary plane and a substantially central opening arranged to receive a current carrying conductor through the opening and through the primary plane;
a first electrostatic shield arranged adjacent a first side of the current sensing coil and comprising a first core shield portion extending at least partially through the substantially central opening of the current sensing coil; and
a second electrostatic shield arranged adjacent a second side of the current sensing coil and comprising a second core shield portion extending at least partially through the substantially central opening of the current sensing coil;
wherein the first core shield portion and second core shield portion together provide electrostatic shielding to the current sensing coil at the opening.

DRAWINGS

Aspects of the present disclosure are described, by way of example only, with reference to the following drawings, in which:

FIGS. 7A, 7B and 7C show details of the shielded current sensing device assembly of FIG. 5;

The representations shown in the Figures are not drawn to scale.

DETAILED DESCRIPTION

In order to improve the accuracy of current sensing coils, the inventors thoroughly investigated the different factors that may have a negative impact on current sensing accuracy. It was through these investigations that they unexpectedly identified a characteristic—electrostatic coupling between a current carrying conductor and the current sensing coil, which is explained in detail below with reference to FIGS. 1 and 2—that at first may appear insignificant, but on further detailed investigation was recognised to have a significant negative effect on accuracy. The electrostatic shield of the present disclosure has been specially designed to be capable of relatively straightforward, low cost, manufacturing processes and straightforward fitting to current sensing coils in order to reduce or eliminate the above mentioned electrostatic coupling. By reducing or eliminating the electrostatic coupling, an improvement in the accuracy of current sensing of the current sensing coil can be realised.

Figure 1:
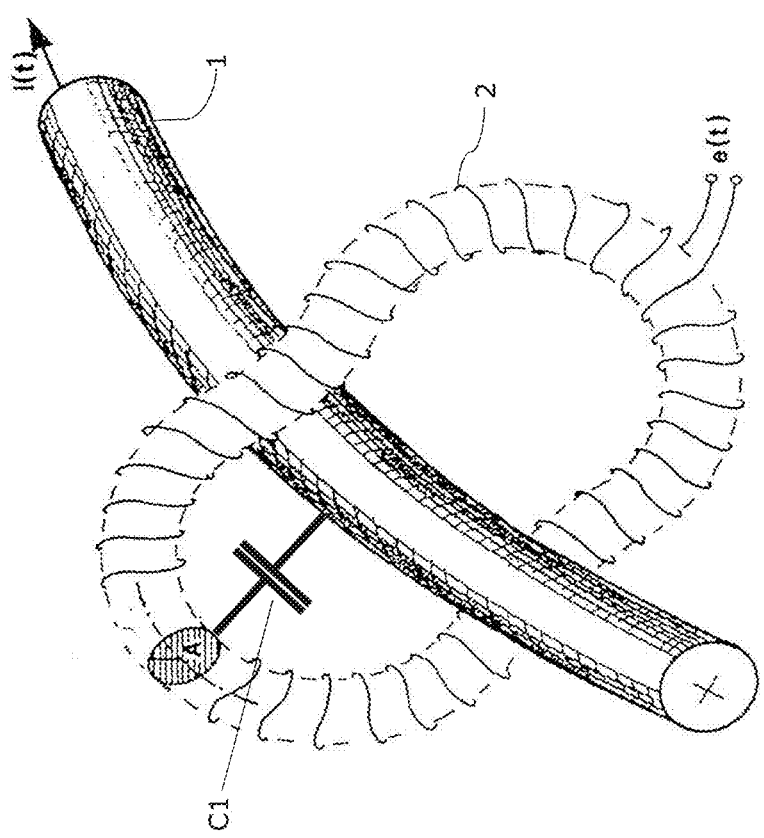
FIG. 1 shows a highly schematic diagram of a current sensing coil.

FIG. 1 shows a highly schematic diagram of a current sensing coil 2 that surrounds a current carrying conductor 1. The voltage, e(t), induced in the current sensing coil 2 by the AC current I(t) can be measured across the terminals of the current sensing coil 2 and used to determine the AC current I(t) passing through the current carrying wire 1.

The current sensing coil 2 is typically held at a neutral or grounded or earthed potential, whereas the current carrying conductor 1 is typically at a different potential, for example it is typically at the line or phase voltage of an electrical power supply. For example, if the current sensing coil 2 is used for domestic power supply measurements in a utility meter, in Europe the current carrying conductor would be at a potential of about 230V. This causes a potential difference between the current carrying conductor 1 and the current sensing coil 2. Alternatively, a potential difference may be caused by the current sensing coil 2 being at a phase voltage and the current carrying conductor 1 being at a different phase voltage, or at neutral, etc.

FIG. 1 shows a representation of the capacitance C1 of electrostatic coupling that exists between the current carrying conductor 1 and the current sensing coil 2, by virtue of the potential difference. The current sensing coil 2 has some inherent impedance in its wire and electrostatic coupling between the current carrying conductor 1 and the current sensing coil 2 causes a current to be injected into the impedance of the current sensing coil 2. That injected current turns into a voltage due to the inherent impedance of the current sensing coil 2.

Figure 2:
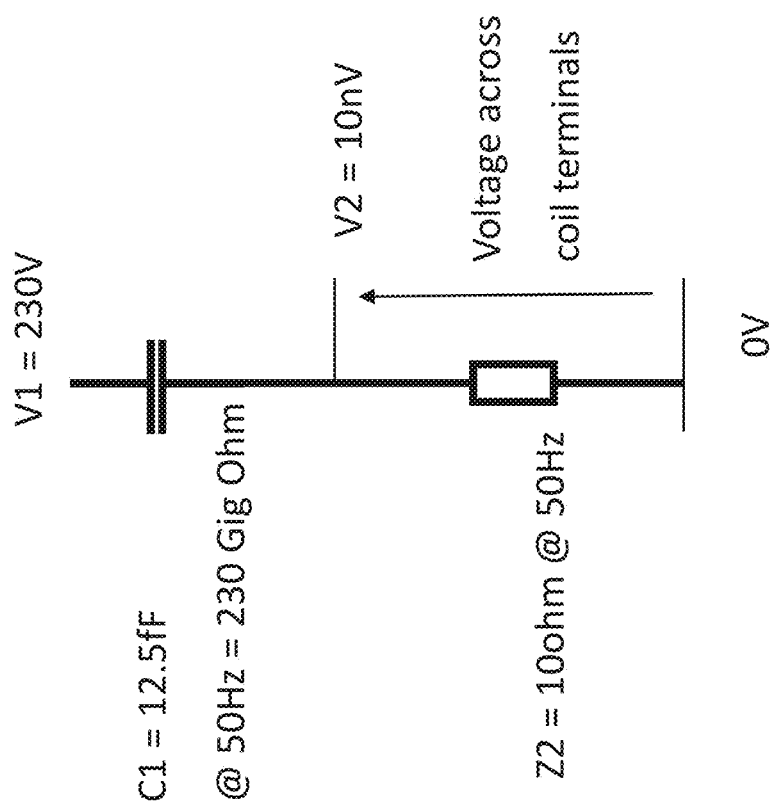
FIG. 2 shows a schematic diagram of an equivalent electrical circuit of FIG. 1.

FIG. 2 shows a schematic diagram of an equivalent electrical circuit showing the electrostatic coupling capacitance C1 and an inherent impedance Z2 of the current sensing coil 2. Whilst the inherent impedance Z2 is represented as a resistor in the diagram, it will be appreciated that the current sensing coil 2 may also have inherent capacitance and/or inductance, so the inherent impedance Z2 may be made up of resistive and capacitive and/or inductive components. The current carrying conductor 1 is at potential, V1, which in this example is 230V with a frequency of 50 Hz, although it may be at any other voltage and frequency. The coupling capacitance C1 in this example is assumed to be about 12.5 fF, although it may be different depending of the design and/or materials of the current sensing coil 2 and the current carrying conductor 1, etc. The coupling capacitance C1 has an impedance of about 230 GΩ at a frequency of 50 Hz and the inherent impedance Z2 in this example is assumed to be about 10Ω at a frequency of 50 Hz, although it may have a different level of impedance depending on the design and/or materials of the current sensing coil 2.

In this example, one of the terminals of the current sensing coil is held at 0V, and the voltage across the terminals can be measured to determine the induced alternating voltage e(t) in order to determine the alternating current I(t) passing through the current sensing coil 2. However, as can be seen, the electrostatic coupling capacitance C1 and the inherent impedance Z2 effectively form a potential divider that results in an additional voltage V2 or about 10 nV (in this particular example) across the coil terminals, caused by electrostatic coupling. At first sight, this may appear to be a very small, insignificant value. However, a typical current sensing coil may have a sensitivity of around 10 μV/A, meaning that each 10 μV measured across the coil terminals is indicative of a 1 A current passing through the current carrying conductor 1. Thus, an additional voltage V2 of 10 nV across the current carrying conductor caused by electrostatic coupling equates to a mA false signal. If the current passing through the current carrying conductor 1 is around 100 mA, this represents an error of about 1%, which is significant in many applications. Even if the current passing through the current carrying conductor 1 is larger, for example around 1 A, the error may still be about 0.1%, which again can be significant for some applications.

It will be appreciated that the numbers quoted above have been determined/approximated for one particular arrangement, but for other arrangements they may be different, potentially resulting in greater margins of error. For example, if the size of the electrostatic coupling capacitance C1 is larger, its impedance will be lower and the additional voltage V2 would therefore be larger, and/or if the inherent impedance Z1 is larger, the additional voltage V2 would be larger. This would cause an even greater level of error.

By virtue of these investigations and analysis, the inventors have come to realise that if the amount of electrostatic coupling experienced by the current sensing coil 2 can be decreased, the accuracy of current sensing may be improved. The error caused by electrostatic coupling could be corrected, at least in part, by compensation on the measured signal e(t), in order to reduce or remove the voltage component V2 from the measured voltage e(t). However, the size of the voltage component V2 is likely to change over time as C1 and Z2 may change with component aging and environmental conditions. Therefore, the inventors have devised an electrostatic shield to provide electrostatic shielding between the current sensing coil 2 and the current carrying conductor 1, thereby significantly reducing, or eliminating, electrostatic coupling and the consequent error voltage V2. This should reduce, or eliminate, the measurement error caused by electrostatic coupling throughout the lifetime of the current sensing coil 1, even as components wear and age.

Figure 3:
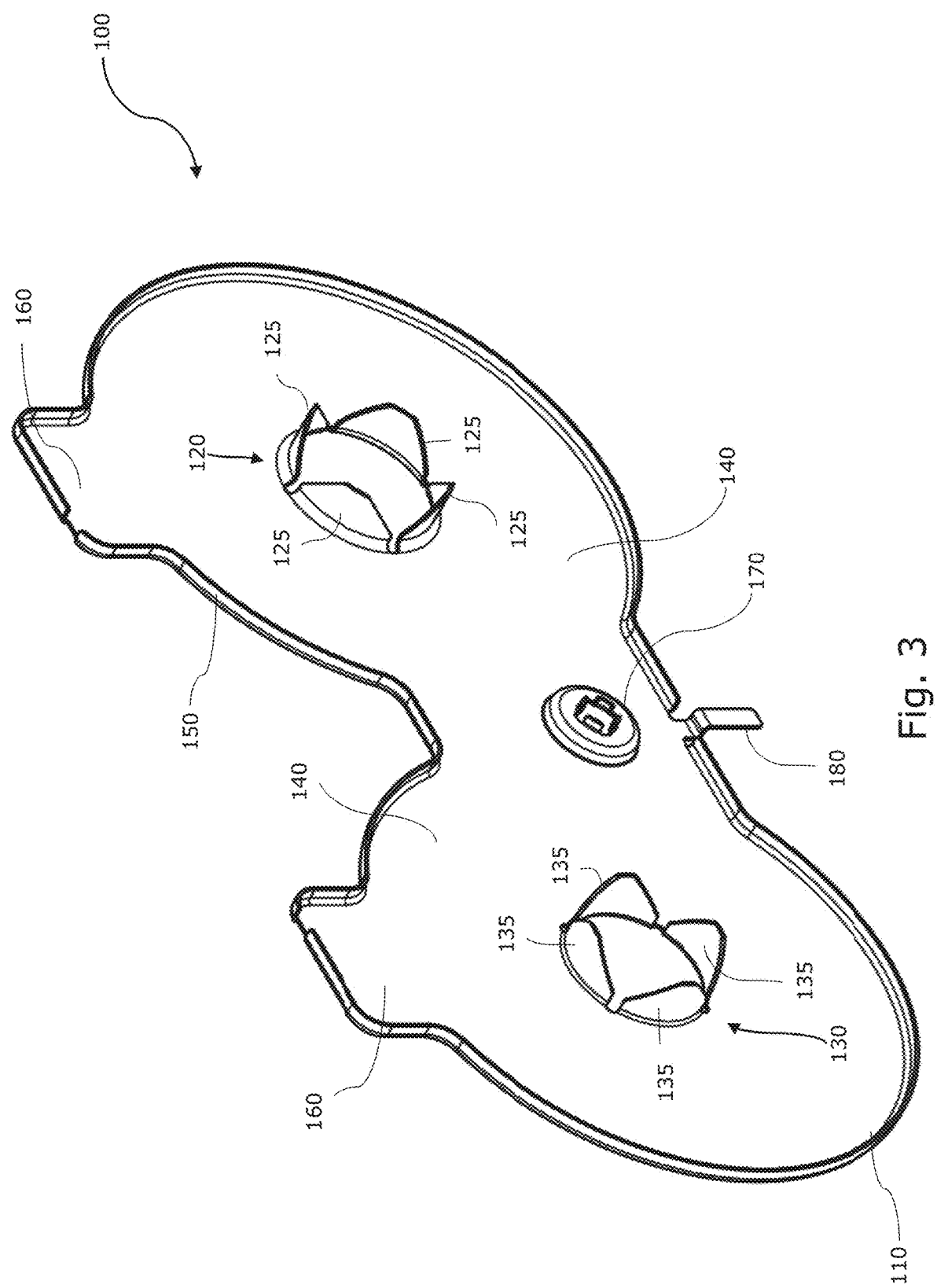
FIG. 3 shows an example representation of an electrostatic shield from an inner side perspective in accordance with an aspect of this disclosure.

FIG. 3 shows an example representation of an electrostatic shield 100 in accordance with an aspect of this disclosure. The representation is from the perspective of an inner side of the electrostatic shield 100.

Figure 4:
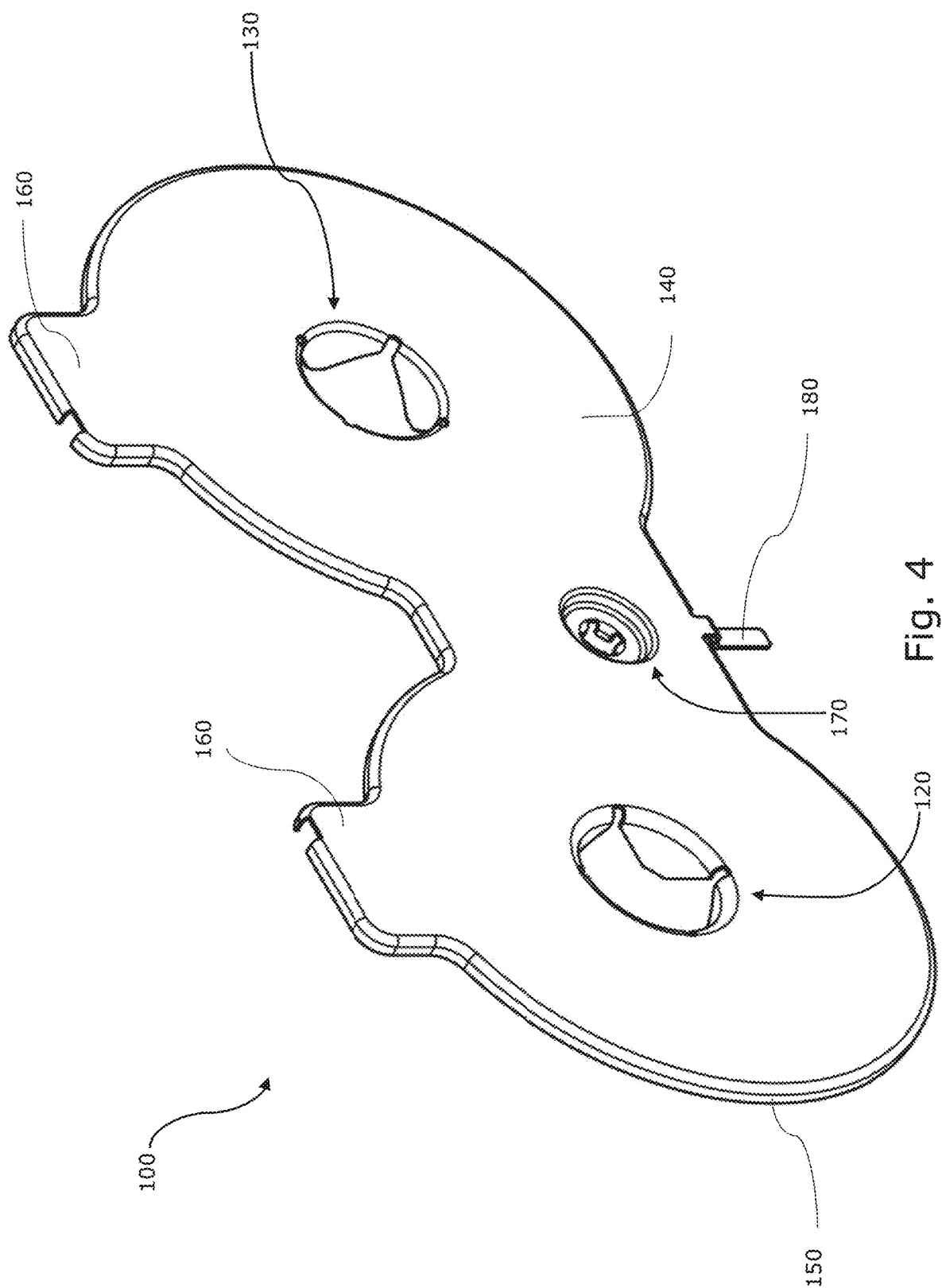
FIG. 4 shows an example representation of the electrostatic shield of FIG. 3 from an outer side perspective.

FIG. 4 shows an example representation of the electrostatic shield from the perspective of an outer side of the electrostatic shield 100.

The electrostatic shield 100 comprises a shield body 110, which may comprise any suitable material for providing electrostatic shielding. For example, it may comprise one or more metallic materials, such as a metal coating like nickel, or it may be made of solid metal. In this example, the electrostatic shield 100 is configured to be used to provide electrostatic shielding to two adjacent current sensing coils and the shield body 110 therefore comprises a core shield portion 120 and a further core shield portion 130. The core shield portion 120 is configured such that when the electrostatic shield 100 is used with the current sensing coils, it extends at least partially through a central opening of one of the current sensing coils to shield at least part of the current sensing coil, as will be explained in more detail later. The further core shield portion 130 is similarly configured to extend at least partially through a central opening of the other current sensing coil to shield at least part of that current sensing coil, as will be explained in more detail later.

The shield body 110 also comprises a primary shield portion 140. The core shield portion 120 and the further core shield portion 130 each extend transversely away from the primary shield portion 140. The primary shield portion 140 in this example has a primary plane that, when the shield body 110 is mounted over a first side of the current sensing coils, extends substantially in a direction of a primary plane of the current sensing coils, as will be explained in more detail later. In this example, the primary shield portion 140 is substantially planar, although it may have any suitable shape that enables it to be used with the current sensing coils. Throughout this disclosure, we refer to a primary plane of the current sensing coil as the plane that passes through the substantially central opening and the coil itself (a plane substantially perpendicular to the axis of rotational symmetry of the coil). In the explanations below, the current sensing coil is board mounted, so in those examples the primary plane corresponds with the plane of the board.

The shield body 110 also comprises an outer wall 150 that projects transversely away from the primary shield portion 140. It extends around a substantial part of the perimeter of the primary shield portion 140. In this particular example, there are some small breaks in the outer wall 150, for example at the component shield portions 160 to allow wiring connections to be made to the current sensing coils or components associated with the current sensing coils.

The component shield portions 160 are configured to provide shielding to one or more components that are associated with the current sensing coils, for example amplifier components.

The electrostatic shield 100 of this example further comprises a fastening portion 170 formed in the shield body 110 for use in fastening the electrostatic shield 100 in position relative to the current sensing coils in order to perform electrostatic shielding. The electrostatic shield 100 of this example also comprises a solder tab 180 for use in soldering the electrostatic shield to a voltage terminal, so that the electrostatic shield 100 may be held at a desired voltage, such as neutral or earth or ground. Further details of these features will be explained later.

In the electrostatic shield 100 of this example, the core shield portion 120 comprises four core projections 125, each of which extend transversely away from the primary shield portion 110. The plurality of core projections 125 extend away in a common direction and are arranged in an array corresponding to the shape of the substantially central opening of the current sensing coil. In this example, they are arrayed in a substantially circular or annular arrangement, such that when the electrostatic shield 100 is viewed from a direction substantially perpendicular to the primary plane of the primary shield portion 140, the core projections 125 are arrayed around a substantially circular or annular shape. However, it will be appreciated that if the central opening of the current sensing coil is a different shape, the core projections 125 may also be arrayed around in a corresponding shape. The core projections 125 are arrayed such that there is a gap between each adjacent core projection 125. By arranging the plurality of core projections 125 in such an array, with gaps between each adjacent core projection 125, it may be possible to manufacture the electrostatic shield 100 quickly and cheaply, for example using a metal extrusion process where the core projections 125 could be manufactured to a length that may not be feasible without the gaps. The extrusion process could be performed as part of the stamping process in which the shield is cut out of a sheet of metal. For example by using an extrusion punch. The material for the core projections could be dragged through by the same tool that is used to cut the sheet, or by a separate secondary process step. The core projections 125 can therefore be made long enough to extend a significant amount of the way, if not all of the way, through the central opening of a current carrying coil (as will be appreciated in more detail later), without requiring a complex manufacturing process. The gaps between the adjacent core projections 125 may also allow for manufacture of the electrostatic shield 100 by other relatively straightforward methods such as stamping, bending and pressing. It is also possible, regardless of the presence of absence of gaps between adjacent pore projections 125, to manufacture the electrostatic shield 100 by other means, such as casting, milling and 3D printing, amongst other means. In this embodiment, each of the plurality of core projections is formed from a bent portion of the primary shield portion. With this approach, the primary shield body and the plurality of core projections may be formed from a single sheet of material (such as metal, or some other electrical conductor, or a non-conductive material that may be coated with a conductive material) that is selectively bent to form the plurality of core projections.

The plurality of core projections may be formed from a bent portion of the primary shield portion. The plurality of core projections may be formed from a region of the primary shield portion which is away from the edges of the primary shield portion. For example, the plurality of core projections may be defined by a central part of the primary shield portion. The plurality of core projections may be formed from a cut and bent portion of the primary shield portion. The term "cut" encompasses any processing step by which the plurality of core projections are at least partially separated from the adjacent parts of the primary shield portion. This includes, but is not limited to, one or more of blanking, punching, piercing, notching, perforating, shaving, slitting, lancing, or pressing. In certain embodiments, the plurality of core projections are formed by extrusion. In such a process, the plurality of core projections may be formed by stretching the material. This process step may be carried out at the same time and in the same tool as a stamping step by which the electrostatic shield is cut to size. With this approach, the number of processing steps required to form the plurality of core projections can be reduced. Where the plurality of core projections are formed by extrusion, this may be carried out without the need to first cut the material. The plurality of core projections may be formed by a combination of extrusion and bending, both of which may be carried out during a stamping step. This combination can allow the length of the projections to be increased. In such an approach, cuts or slits may be formed in the material to facilitate the bending process.

The plurality of core projections are connected to the primary shield portion by a bend. In this manner, the core projections are integral with the primary shield portion but extend transversely to it. The bend may be linear or non-linear. The term "selectively bent" refers to any appropriate process by which part of the primary shield portion is deformed by the application of force to cause it to extend at an angle to the rest of the primary shield portion while remaining at least partially attached.

Each core projection 125 comprises a base connection to the primary shield portion 140 and a tip distal from the base connection, where the tip is narrower than the base connection. As a result of this shape, each core projection 125 has a tapered shape and the gap between each adjacent core projection 125 is wider towards the tips than it is towards the base connections. The core projections 125 may therefore be manufactured in many straightforward, low cost ways, such as cutting and then bending (for example, in the design represented in the Figures, by making a cross-shaped cut in a sheet of material forming the primary shield portion 140, and then bending the resultant four portions out to form the core projections 125, with an optional final step of removing the resultant sharp tip from each core projection 125).

The further core shield portion 130 likewise comprises similar core projections 135. However, the diameter of the core shield portion 120 (for example, as viewed from a direction substantially perpendicular to the primary plane of the primary shield portion 140) is smaller than the diameter of the further core shield portion 130 (for example, as viewed from a direction substantially perpendicular to the primary plane of the primary shield portion 140).

Figure 5:
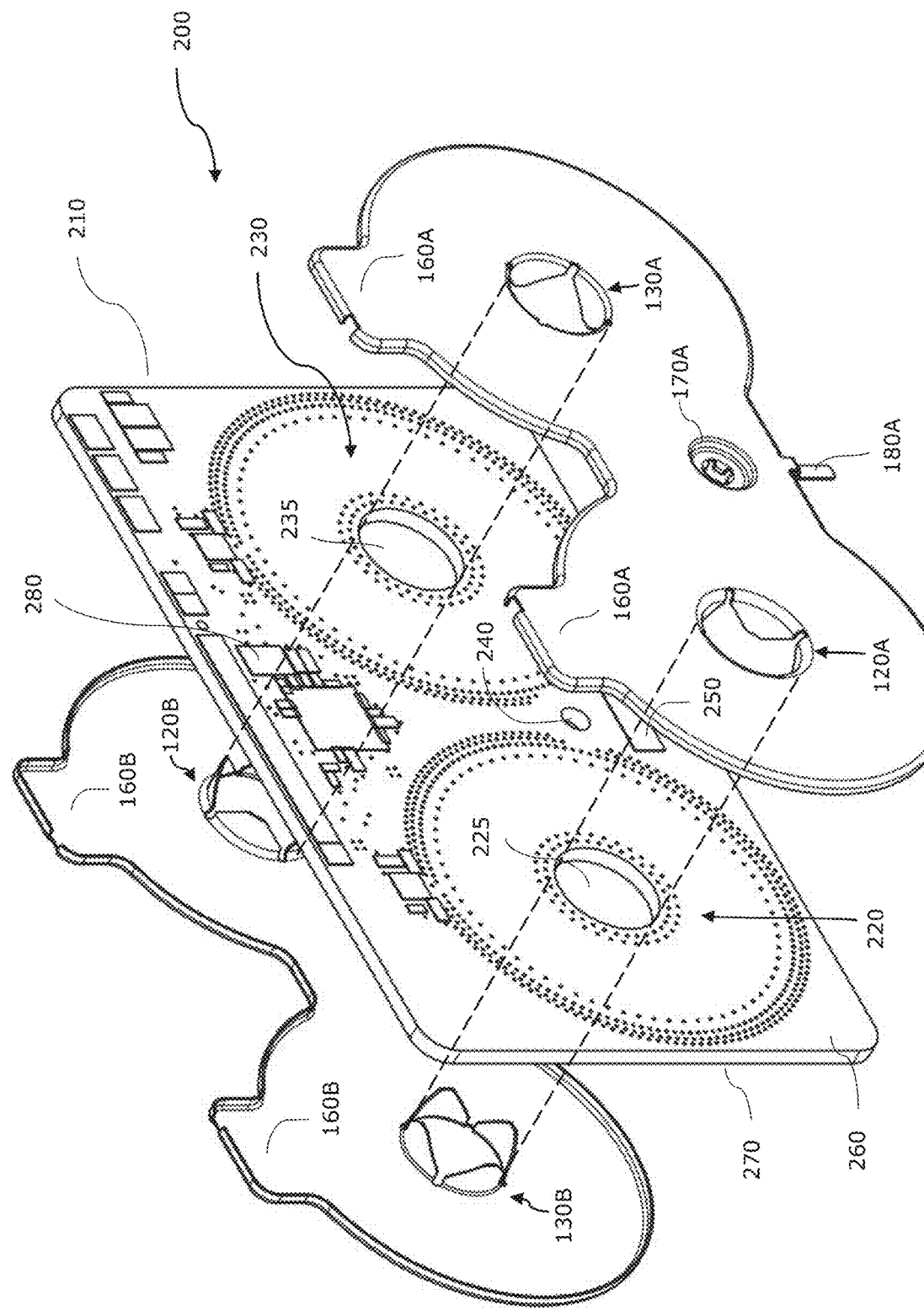
FIG. 5 shows an example representation of an exploded view of a shielded current sensing device assembly comprising the electrostatic shield of FIG. 3.

FIG. 5 shows an example representation of an exploded view of a shielded current sensing device assembly 200 in accordance with an aspect of the present disclosure. The assembly 200 comprises a first electrostatic shield $100_A$ with a first shield body $110_A$ and a second electrostatic shield 100 with a second shield body $100_B$, each of which are the same as the electrostatic shield 100 described earlier and can together form an electrostatic shield. The assembly 200 also comprises a current sensing device 210, which in this case is a printed circuit board (PCB). The current sensing device 210 in this example comprises a first current sensing coil 220 and a second current sensing coil 230, that are each configured for sensing the current in a current carrying conductor. The first and second current sensing coils 220, 230 may be, for example, Rogowski coils. The first current sensing coil 220 has a first substantially central opening 225 arranged to receive a current carrying conductor through the opening 225 and through the primary plane of the first current sensing coil 220 (in this example, because the board is planar, the primary plane of the first current sensing coil 220 corresponds with the plane of the board). Likewise, the second current sensing coil 230 has a second substantially central opening 235 arranged to receive a current carrying conductor through the opening 235 and through the primary plane of the second current sensing coil 230 (in this example, because the board is planar, the primary plane of the second current sensing coil 230 corresponds with the plane of the board). The coil wiring of each coil 220 and 230 is not represented for the sake of simplicity, however the 'doughnut' shape formed by the coil wiring of each coil 220 and 230 is readily appreciable. Detailed examples and explanations of board mounted current sensing coils can be found in US2017/0356934 A1, which is incorporated herein in its entirety by reference.

The current sensing device 210 further comprises a mounting part 240 and a board voltage terminal 250. The current sensing device 210 also has a first board surface 260 and a second, opposing, board surface 270, which cannot be seen in FIG. 5 owing to the perspective represented. The current sensing device 210 also comprises various components 280 associated with the two current sensing coils 220 and 230, for example amplifiers and signal measurement components, etc.

As can be seen in FIG. 5, when the first electrostatic shield $100_A$ is mounted on the first board surface 260, the first core shield portion $120_A$ will extend at least partially through the first substantially central opening 225 and the first further core shield portion $130_A$ will extend at least partially through the second substantially central opening 235. Likewise, when the second electrostatic shield $100_B$ is mounted on the second board surface 270, the second core shield portion $120_B$ will extend at least partially through the second substantially central opening 235 and the second further core shield portion $130_B$ will extend at least partially through the first substantially central opening 225.

Figure 6:
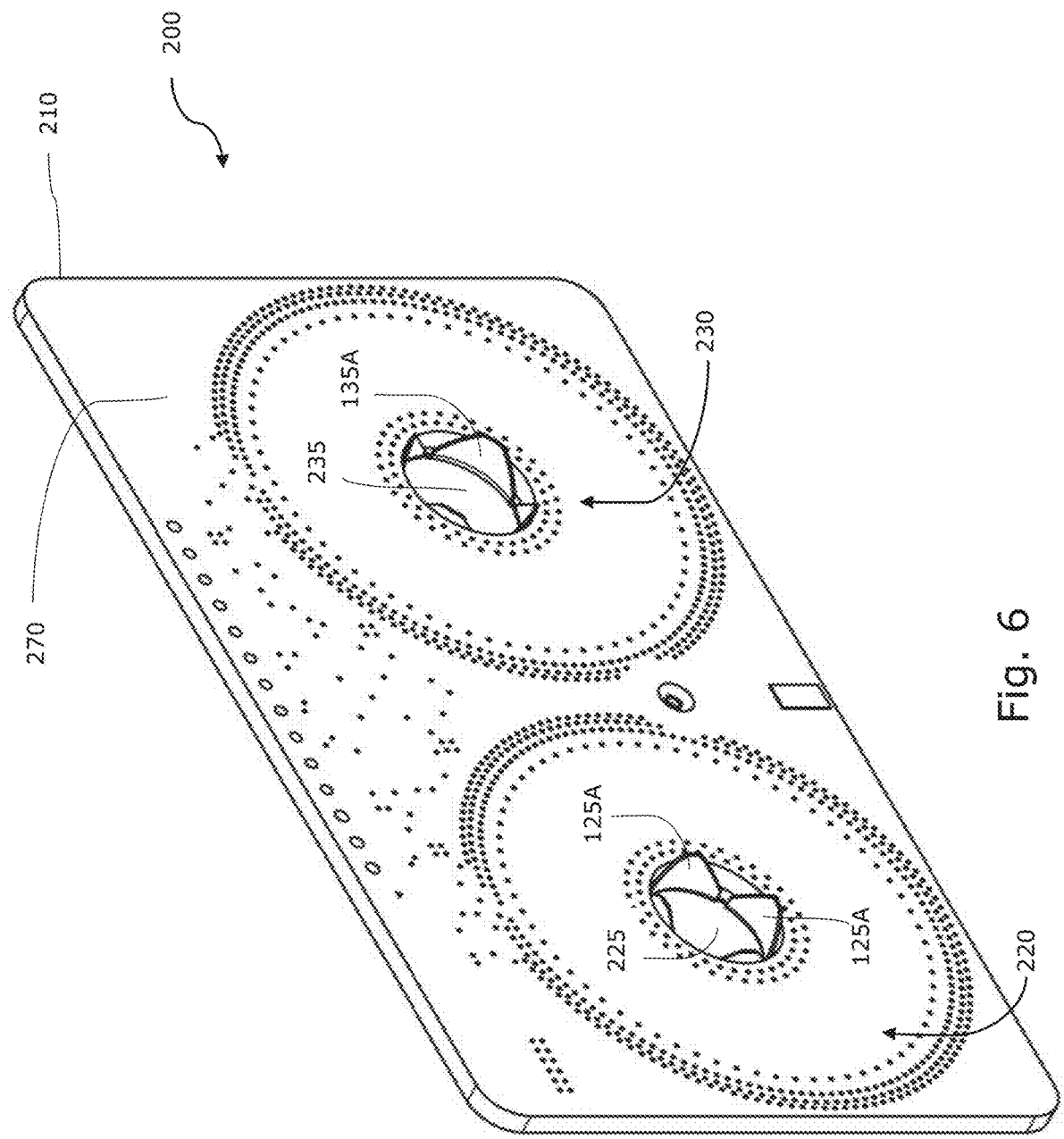
FIG. 6 shows an example representation of part of the shielded current sensing device assembly of FIG. 5.

FIG. 6 shows a representation of the shielded current sensing device assembly 200 from the other side of the current sensing device 210, such that the second, opposing board surface 270 is visible. The second electrostatic shield 100 has been omitted for clarity purposes. The first electrostatic shield $100_A$ has been mounted on the first board surface 160 and the core projections $125_A$ of the first core shield portion $120_A$ of the first electrostatic shield $100_A$ extend, at least partially, through the first opening 225. Likewise, the first further core projections $135_A$ of the first further core shield portion $130_A$ of the first electrostatic shield $100_A$ extend, at least partially, through the second opening 235. In this example, the first core projections $125_A$ and the first further core projections $135_A$ extend through the openings 225 and 235 respectively such that the distal end tips of the projections $125_A$ and $135_A$ extend beyond the second board surface 270. However, in other implementations, the projections $125_A$ and $135_A$ may be relatively shorter (and/or the board may be relatively thicker) such that they do not project beyond the second board surface 270. When the second electrostatic shield $100_B$ is mounted on the second board surface 270, its second core shield portion $120_B$ and second further core shield portion $130_B$ will likewise extend, at least partially, through the second opening 235 and the first opening 225 respectively.

Thus, it can be seen that mounting one of the electrostatic shields $100_A$ or $100_B$ on their respective surface of the current sensing device 210 may provide some amount of electrostatic shielding for the inner periphery of the current sensing coils from their respective current carrying conductors. Consequently, the accuracy of measurements achieved by the current sensing coils may be improved.

However, it can be seen that parts of the openings 225 and 235 would not be shielded, such that parts of the inner periphery of each current sensing coils would be exposed for electrostatic coupling to the current carrying conductors passing through the openings 225 and 235. This situation may be significantly improved by mounting both the first electrostatic shield $100_A$ on the first board surface 260 and the second electrostatic shield $100_B$ on the second board surface 270. In the example configuration represented in FIG. 5, the first core projections $125_A$ of the first electrostatic shield $100_A$ are arranged to align with the gaps in the second further core shield portion $130_B$ of the second electrostatic shield $100_B$, and the second further core projections $135_B$ of the second electrostatic shield $100_B$ are arranged to align with the gaps in the first core shield portion $120_A$ of the first electrostatic shield $100_A$. Likewise, the first further core projections $135_A$ of the first electrostatic shield $100_A$ are arranged to align with the gaps in the second core shield portion $120_B$ of the second electrostatic shield $100_B$, and the second core projections $125_B$ of the second electrostatic shield $100_B$ are arranged to align with the gaps in the first further core shield portion $130_A$ of the first electrostatic shield $100_A$.

This may be appreciated from FIGS. 7B and 7C, which show a detailed representation of the interaction of the core projections of the first and second electrostatic shields $100_A$ and $100_B$ when mounted on their respective surfaces of the current sensing device 210. FIG. 7C shows in detail the arrangement at the second hole 235 and FIG. 7B shows in detail the arrangement at the first hole 225. It can be seen that the amount of shielding provided to the inner periphery of each of the current sensing coils 220 and 230 is significantly improved, such that the first core shield portion $120_A$ of the first electrostatic shield $100_A$ and the second further core shield portion $130_B$ of the second electrostatic shield $100_B$ together define a first core shield to provide electrostatic shielding to the first opening 225 and the first further core shield portion $130_A$ of the first electrostatic shield $100_A$ and the second core shield portion $120_B$ of the second electrostatic shield $100_8$ together define a second core shield to provide electrostatic shielding to the second opening 235. Thus, electrostatic shielding may be significantly improved, resulting in a significant improvement in the accuracy of measurement of the current sensing coils 220 and 230, with electrostatic shields that are relatively easy to manufacture and fit to the current sensing device 210.

Furthermore, in this particular arrangement, as explained earlier, the diameter of the core shield portion 120 is smaller than the diameter of the further core shield portion 130. Consequently, when the first and second electrostatic shields $100_A$ and $100_B$ are mounted on the board of the current sensing device 210, the first core shield portion $120_A$ is able to overlap with the second further core shield portion $130_B$, and the second core shield portion $120_B$ is able to overlap with the first further core shield portion $130_A$. This means that substantial electrostatic shielding may be provided by the core shield portions and further core shield portions, without requiring the high precision manufacturing that may be required if the core shield portions 120 and further core shield portions 130 had the same diameter and were designed to physically engage with each other. Furthermore, the thickness of the board of the current sensing device 210 (i.e., the distance between the first board surface 260 and the second board surface 270) may be variable between different types and designs of board, and may have manufacturing variability (for example, the thickness of PCBs may vary by about +/−10%). When each of the electrostatic shields $100_A$ and $100_B$ are mounted on their respective board surfaces, their outer walls $150_A$ and $150_B$ and fastening portions $170_A$ and $170_B$ may be in contact with the board surfaces. The amount by which the core shield portions $120_A$ and $120_B$ and further core shield portions $130_A$ and $130_B$ extend through the openings 225 and 235 may therefore depend on the exact thickness of the board. By designing the core shield portions $120_A$ and $120_B$ to be overlapable with the further core shield portions $130_A$ and $130_B$ as described above, this variability may be accommodated by virtue of the core shield portions $120_A$ and $120_B$ and further core shield portions $130_A$ and $130_B$ overlapping with each other to a greater or lesser extent when mounted on the board. Thus, the electrostatic shields $100_A$ and $100_B$ may together provide a good level of electrostatic shielding, regardless of the exact thickness of the board on which they are mounted without requiring high levels of manufacturing precision.

Additionally, the first and second electrostatic shields $100_A$ and $100_B$ can be identical components, meaning that only one machine needs to be tooled up for manufacture, which may save further manufacturing costs. It should be noted, however, that in an alternative aspect of the disclosure, the electrostatic shields may not be identical. For example, if they are designed for use with an odd number of adjacent current sensing coils, core shield portion(s) of one of the electrostatic shields may be of the 'core shield portion 120' type, and the core shield portion(s) of the other electrostatic shield may be of the 'further core shield portion 130' type, so that when the two different electrostatic shields are mounted on opposing surfaces of a board, their core shield portions can overlap with each other in current sensing coil opening(s). Additionally, or alternatively, the length of the core shield portions may be different on different electrostatic shields. For example, if a board comprises components (such as amplifiers, integrators, etc.) on one of its surfaces that need to be shielded, the electrostatic shield designed for mounting on that surface may be designed to have its primary shield portion 140 higher above the board surface than the primary shield portion of the electrostatic shield designed for mounting on the other surface. By reducing the distance at which a mounted electrostatic shield sits from the board, it may be possible to increase the amount by which the core shield portion extends through the opening of a coil case, particularly where the length of the core shield portion is limited, for example by the manufacturing method. This may make it possible for the electrostatic shields to be made compatible with thicker boards, for example.

Figure 8:
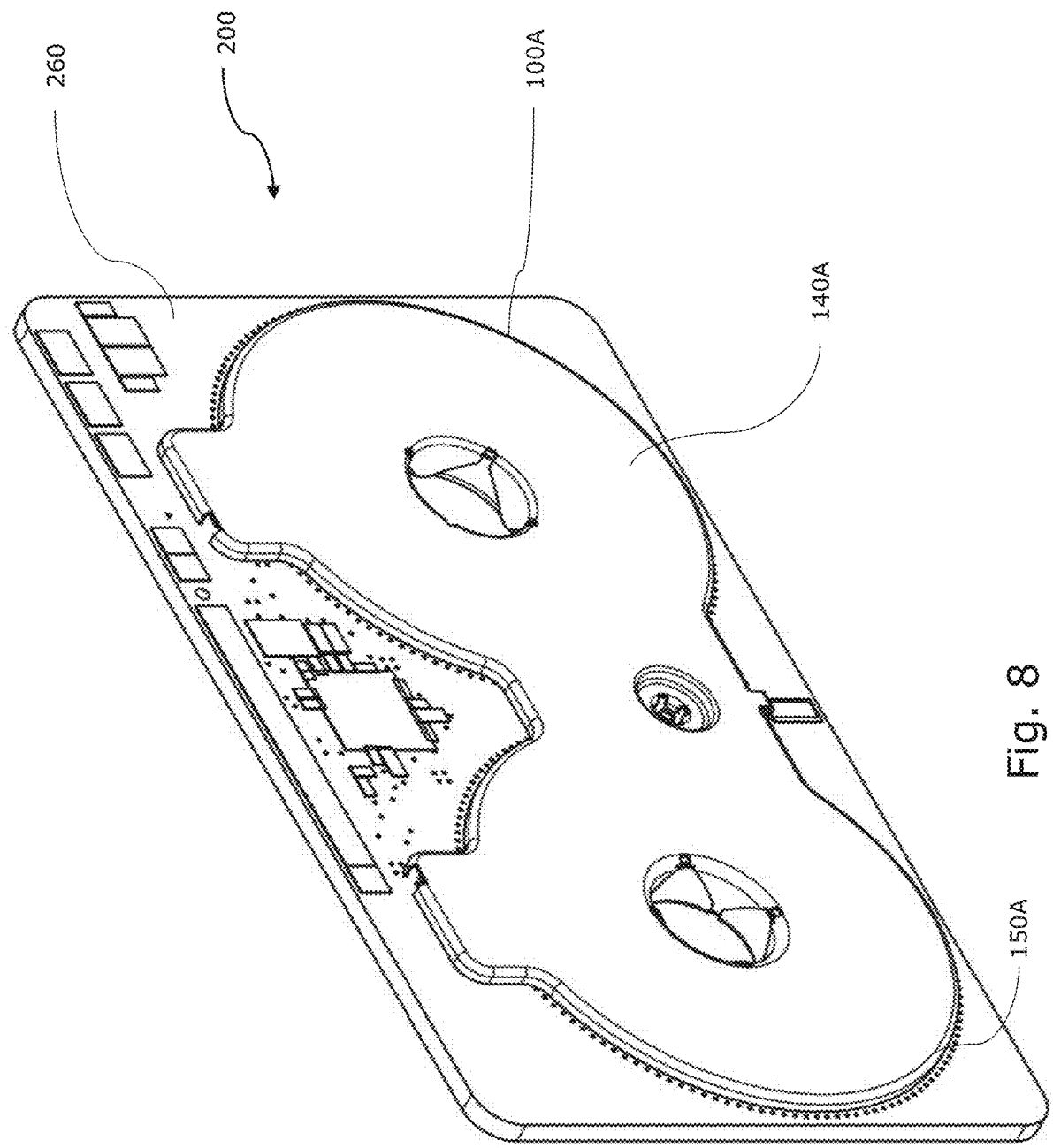
FIG. 8 shows an example perspective view of the shielded current sensing device assembly of FIG. 5.
Figure 9:
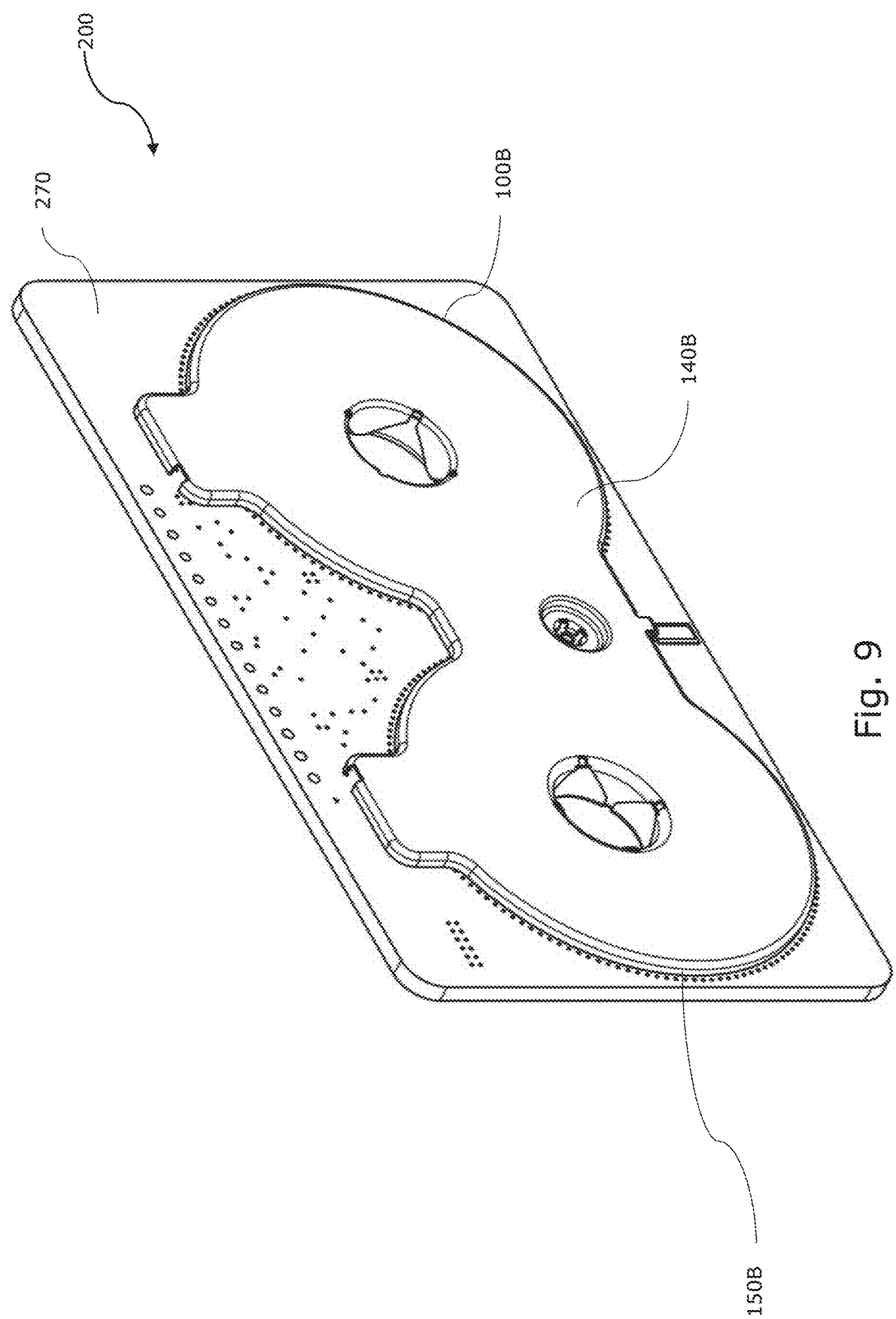
FIG. 9 shows a further example perspective view of the shielded current sensing device assembly of FIG. 5.

FIG. 8 shows an example perspective view of the shielded current sensing device assembly 200 with the first and second electrostatic shields $100_A$ and $100_B$ mounted on the board. FIG. 9 shows a further example perspective view, from the other side of the board, of the shielded current sensing device assembly 200 with the first and second electromagnetic shields $100_A$ and $100_B$ mounted on the board. Not all of the reference numerals are represented in these figures for the sake of simplicity. As can be seen, not only can the core shield portions 120 and further core shield portions 130 provide electrostatic shielding to the current sensing coils, but the primary shield portion 140 and the outer wall 150 can also provide electrostatic shielding, for example shielding electrostatic coupling of the current sensing coils along the primary plane of the current sensing coils. This may be particularly useful for providing further shielding from the current carrying conductor, for example if the current carrying conductor is not perfectly straight, but instead bends towards the primary plane of the current sensing coils.

FIG. 7A shows a close up representation of the fastening portion 170 and the solder tab 180. The fastening portion is configured to enable the electrostatic shield 100 to be mechanically fastened to a surface of the board of the current sensing device 210. In this particular implementation, the fastening portion 170 is configured to engage with the board mounting part 240, for example by protruding into the board mounting part 240 when the electrostatic shield 100 is mounted on the board (as can be seen with reference to FIG. 5). In this way, positioning of the electrostatic shield 100 on the board may be simplified, although it will be appreciated that such engagement between the board mounting part 240 and the fastening portion 170 is optional. A suitable form of mechanical faster may be used to fasten the electrostatic shield 100 to the board, for example a rivet, bolt or screw may fasten them together and/or glue may be used, etc. It should be appreciated that this is merely one example way of fixing the electrostatic shield 100 to the board and the electrostatic shield may be configured for fixing in any other suitable way, for example depending on the particular type of current sensing coil it is designed for. For example, the electrostatic shield(s) may be fixed to the board may some form of compressive force, such as a band or clamp or box on the outside of two electrostatic shield, exerting a compressive force that causes the electrostatic shields to sandwich a board mounted current sensing coil(s).

The solder tail 180 is configured to be soldered to the board voltage terminal 250, for example a neutral or earth or ground terminal, so that the electrostatic shield 100 can be held at any desired voltage. The solder tail 180 is designed to protrude away from the primary shield portion 140 and the current sensing coils so that the process of soldering should not cause heat damage to any of the components. Additionally, or alternatively, connection to a board voltage terminal 250 may be made by virtue of the board mounting part 240 and the fastening portion 170. For example, the board voltage terminal 250 may be co-located, or located adjacent to, the board mounting part 250, such that a conducting fasting means, such as a metal rivet or screw, can form an electrical coupling between the electrostatic shield 100 and the board voltage terminal 250.

Figure 10:
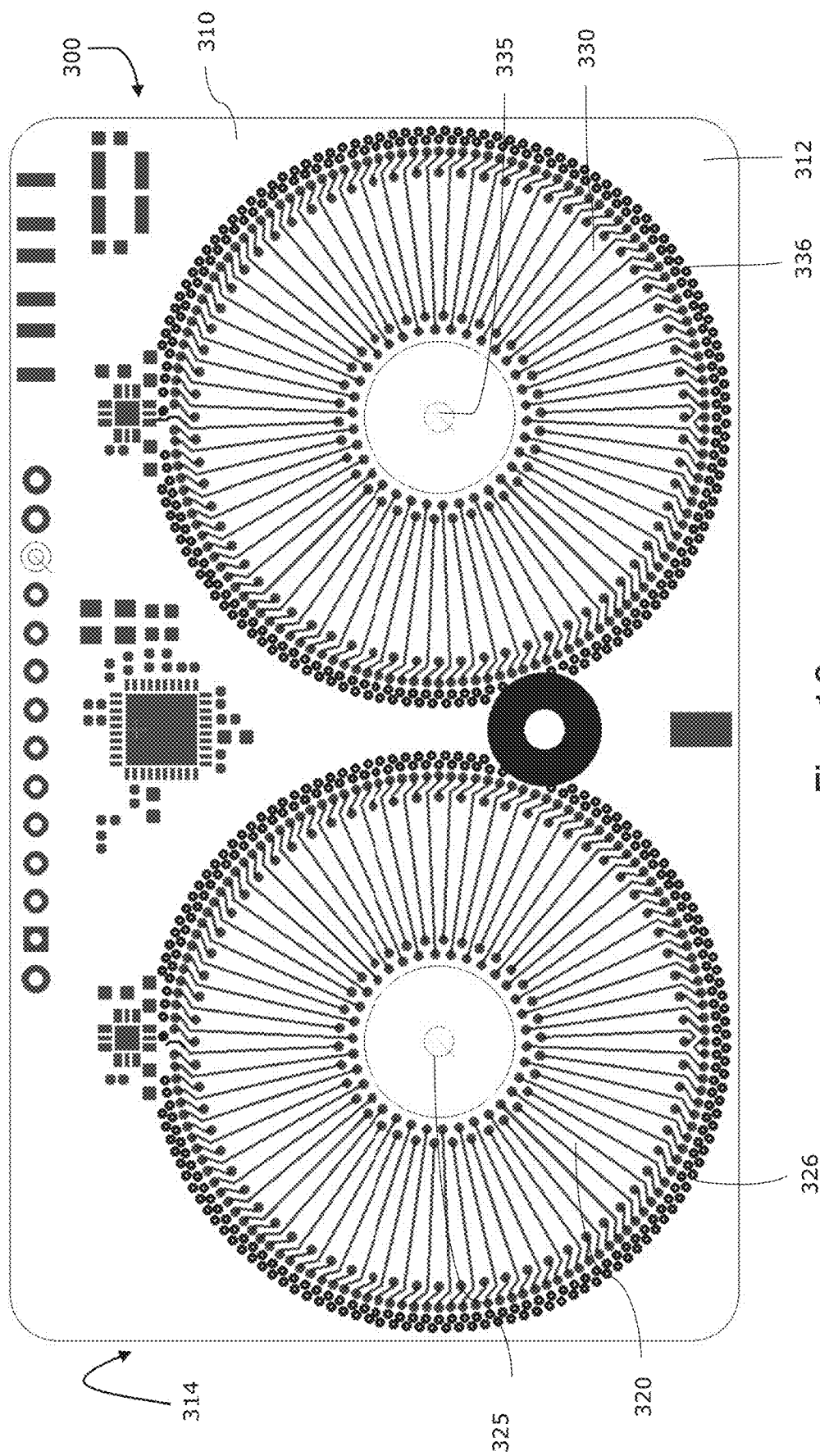
FIG. 10 shows an example representation of a current sensing device in accordance with an aspect of the present disclosure.

FIG. 10 shows an example representation of a current sensing device 300 in accordance with an aspect of the present disclosure. The current sensing device 300 comprises two board mounted current sensing coils—a first current sensing coil 320 and a second current sensing coil 330—such as board mounted Rogowski coils. Both coils are formed on a board 310, such as a printed circuit board (PCB). The first current sensing coil 320 is formed around a first opening 325 in the board 310, which is configured to receive a current carrying conductor, and the second current sensing coil 330 is formed around a second opening 335 in the board 310, which is also configured to receive a current carrying conductor. The coil wiring is represented in FIG. 10, but the configuration of the wiring shall not describe it in detail here as it is not the subject of the present disclosure. However, detailed examples and explanations of such coil wiring can be found in US2017/0356934 A1, which is incorporated herein in its entirety by reference.

It can be seen that in this example there are two inner rings of vias and four outer rings of vias for each current sensing coil 320 and 330. The two inner rings of vias, and the two inner-most rings of the four outer rings of vias, are all for the coil wiring, so that the coil can pass back and forth between a first surface 312 of the board 310 and an opposing second surface 314 of the board 310 (which cannot be seen in FIG. 10 due to the perspective). The two outermost rings of the four outer rings of vias for the first current sensing coil 320 are marked as 326 and the two outermost rings of the four outer rings of vias for the second current sensing coil 330 are marked as 336 in FIG. 10. These vias are electrostatic shield vias that are arranged around the perimeter of the current sensing coils 320 and 330 and they pass through the board 310 between the first surface 312 and the second surface 314 (although in an alternative at least some of the electrostatic shield vias 326 and 336 may pass only part of the way through the board 310 between the first surface 312 and the second surface 314). The electrostatic shield vias 326 and 336 may be filled with, or have their inner walls plated by, an electrically conductive material such as metal. The shape of the electrostatic shield vias 326 and 336 does not have to be cylindrical, but may be any other suitable shape, such as a slit.

Figure 11:
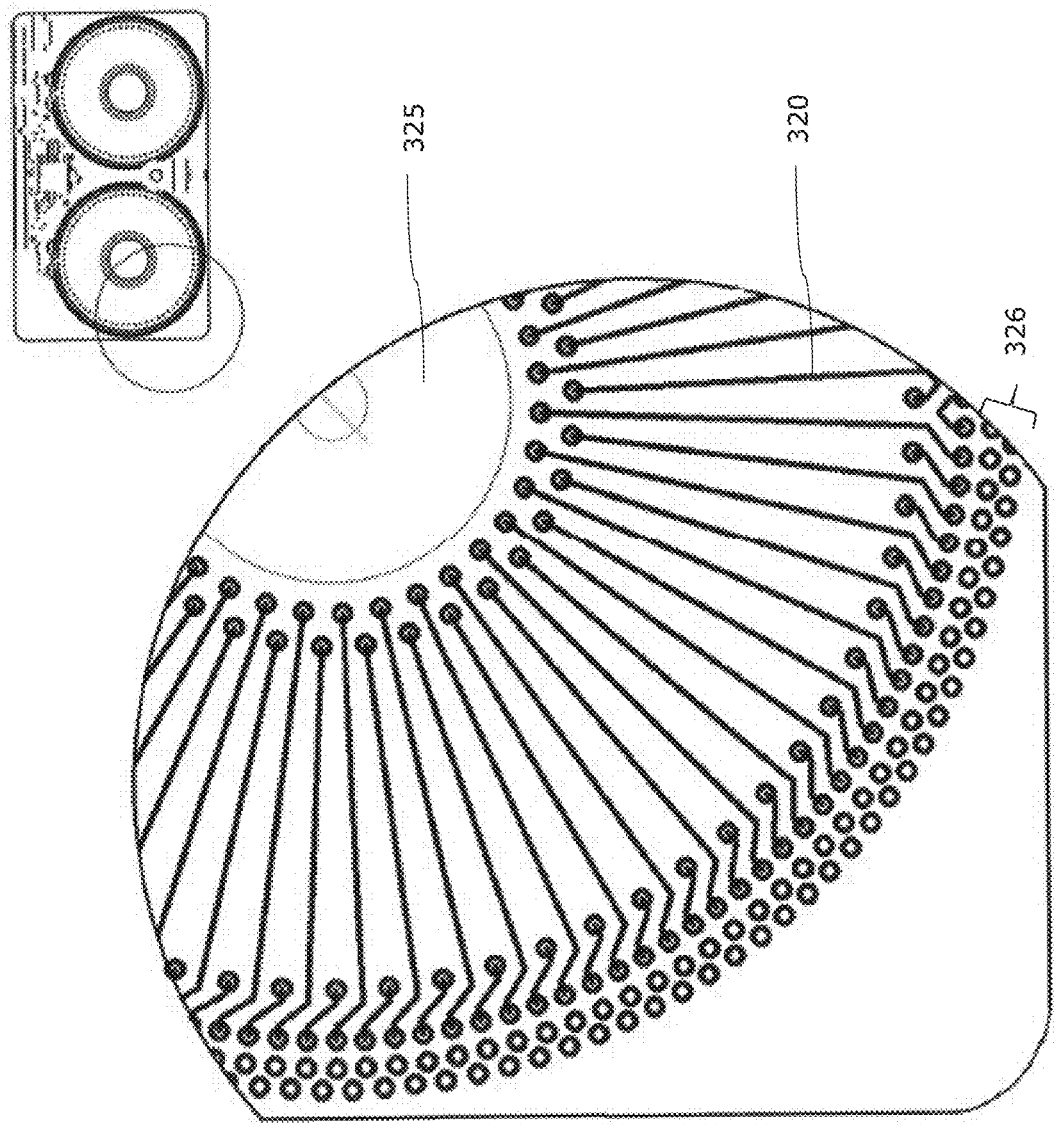
FIG. 11 shows an example close-up view of electrostatic shield vias of the current sensing device of FIG. 10.
Figure 12:
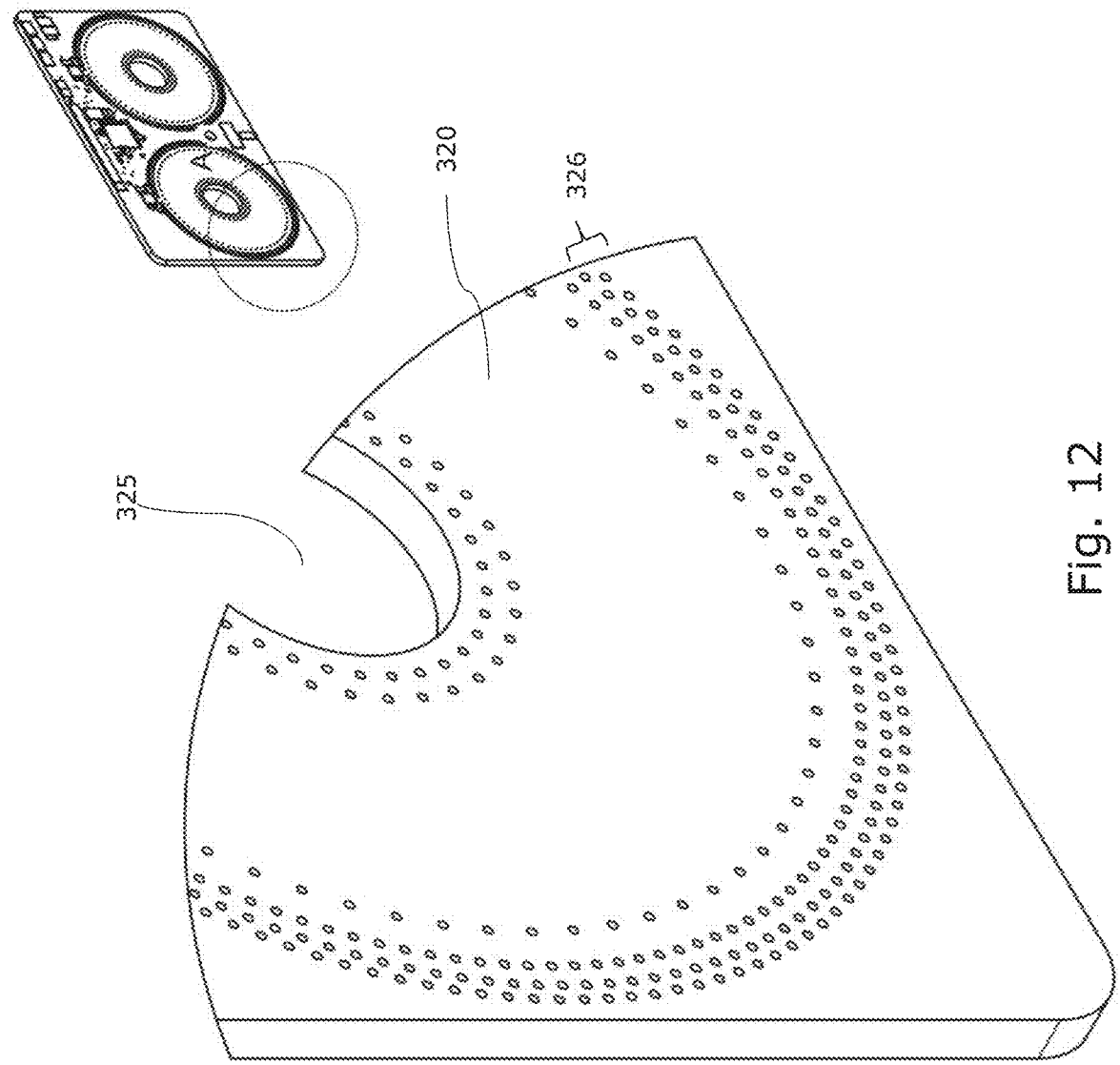
FIG. 12 shows a further example perspective view of the electrostatic shield vias of the current sensing device of FIG. 10.
Figure 13:
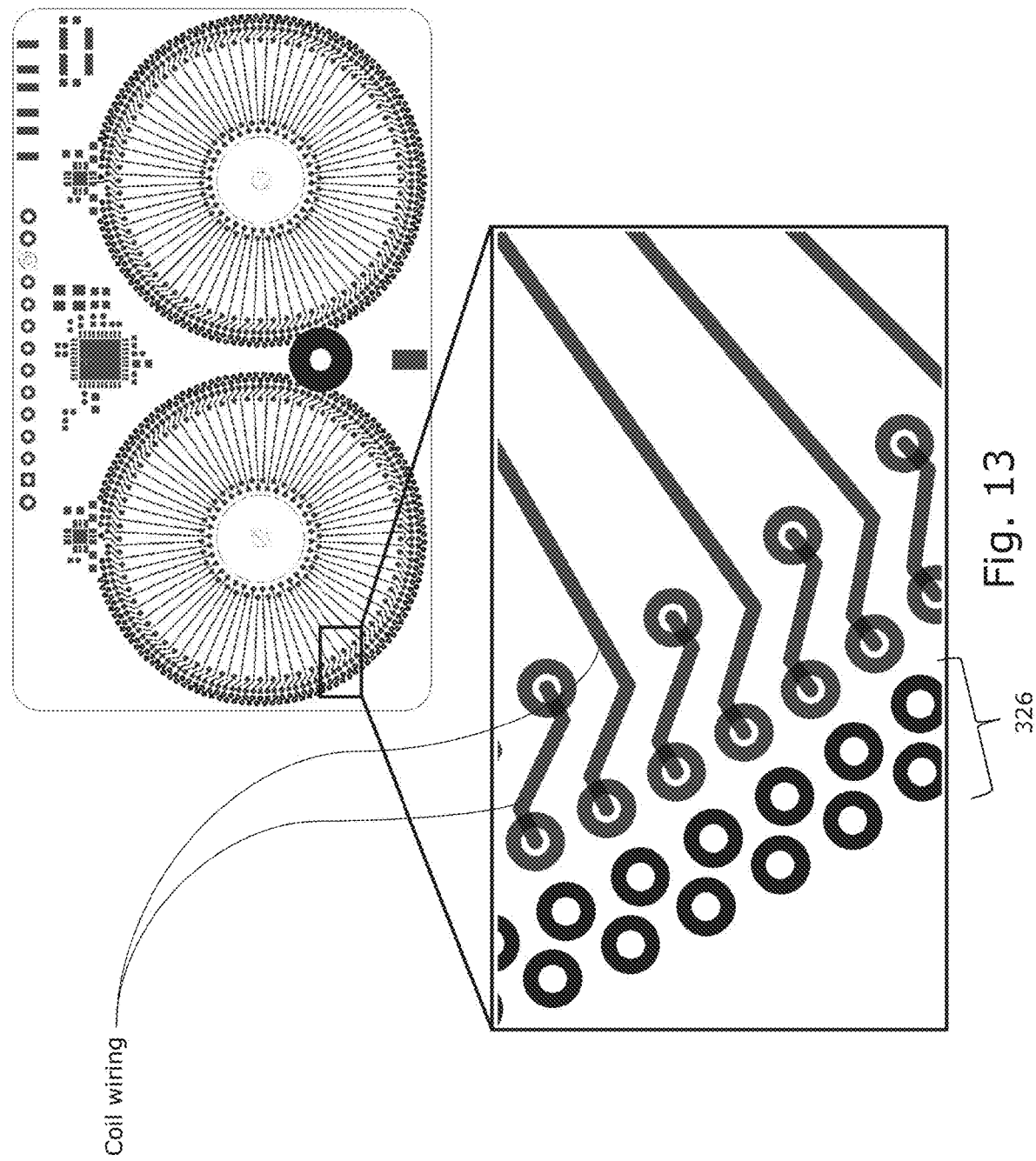
FIG. 13 shows a further example close-up view of electrostatic shield vias of the current sensing device of FIG. 10.

FIG. 11 shows an example close-up view of the electrostatic shield vias 326 and FIG. 12 shows a further example perspective via of the electrostatic shield vias 326. FIG. 13 shows an even closer view of the electrostatic shield vias. The electrostatic shield vias 326 may all be coupled together, and the electrostatic shield vias 336 may all be coupled together, for example by electrical interconnections on a surface of the board 310, or via electrical interconnections beneath the surface, or both, and held at a desired potential, such as neutral, or ground, earth, etc.

The electrostatic shield vias 326 and 336 may provide at least some electrostatic shielding to the outer periphery of the current sensing coils 320 and 330, for example shielding them from the current carrying conductor(s) (if the current carrying conductor(s) is bent around the edges of the board 310 in some way), or any other component/entity that is at a different potential to the current sensing coils 320 and 330. In the arrangements represented in FIGS. 10-13, there electrostatic shield vias 326 and 336 are arranged in two rings around the perimeter of the current sensing coils 320 and 330 each at a different distance from the perimeter of the current sensing coils 320 and 330. The vias in the inner ring are at different angular positions around the perimeter of the coils 320 and 330 to the angular positions of the vias in the outer ring. Consequently, improved electrostatic shielding can be achieved with respect to electrostatic coupling that could take place substantially parallel to the primary plane of the current sensing coils 320 and 330.

Whilst in this example the electrostatic shield vias 326 and 336 are each made up of two rings of vias, in an alternative the electrostatic shield vias 326 and 336 may each be made up of a single ring of vias, which would still provide some electrostatic shielding. Alternatively, there may be electrostatic shield vias 326 and 336 that are each be made up of three or more rings of vias, each at a different distance from the perimeter of the current sensing coils 320 and 330. It should be appreciated that the electrostatic shield vias 326 and 336 around the current sensing coils 320 and 330 do not need to be continuous. For example, they may be more concentrated in areas where a current carrying conductor is expected to pass close to the outer periphery of the current sensing coil.

It will be appreciated that where the electrostatic shield described above and the current sensing device 300 are used in combination, electrostatic shielding may be achieved around almost the entire surface of the current sensing coils 320 and 330. However, even if the electrostatic shield is used with a current sensing device that does not have any electrostatic shield vias, or even where the current sensing device 300 is used without an electrostatic shield, a reduction in electrostatic coupling may still be realised.

The skilled person will readily appreciate that various alterations or modifications may be made to the above described aspects of the disclosure without departing from the scope of the disclosure.

For example, whilst all of the above disclosure is based on configurations for two adjacent current sensing coils, there may alternatively be any number of current sensing coils, for example only one, or three adjacent coils, or four adjacent coils, etc. For example, the electrostatic shield may be configured for use with only a single current sensing coil and therefore have only a single core shield portion. In this case, two different versions of the electrostatic shield body may be manufactured, one version with a core shield portion with a larger diameter than the core shield portion of the other version. If the electrostatic shield is configured or use with four adjacent current sensing coils, the electrostatic shield body it may have four core shield portions, where two may have a smaller diameter and two have a larger diameter, so that only one type of electrostatic shield body needs to be manufactured.

The fastening portion 170 is optional and the electrostatic shield 100 may be mounted to the board in any suitable way. Furthermore, there may be two or more fastening portions 170 on each electrostatic shield 100, to enable more secure fixing.

The component shields 160 are optional. The outer wall 150 is also optional. For example if the wiring of the current sensing coil(s) is not on the surface of the board, or if the electrostatic shield is covered in an insulating material, the primary shield portion could directly contact the surface of the board.

The core shield portion 120 and further core shield portion 130 are each represented as having four, identical core projections 125 and 135 arrayed in a shape corresponding to the openings 225 and 235. However, the core shield portion 120 and further core shield portion 130 may each have any number (one or more) core projections 125 and 135, each of which may be of the same or different shape. Furthermore, whilst the above shows the core projections having a particular tapering shape, the may have any suitable shape either tapering or non-tapering, for example depending on the particular design of the electrostatic shield 100 and/or the current sensing coil(s) and/or the method of manufacturing used for the electrostatic shield 100.

The current sensing coils 320 and 330 described herein are all formed on planar boards. However, they may be formed on non-planar boards, or not be board mounted at all, with the electrostatic shield 100 formed in any suitable complimentary shape.

Figure 14:
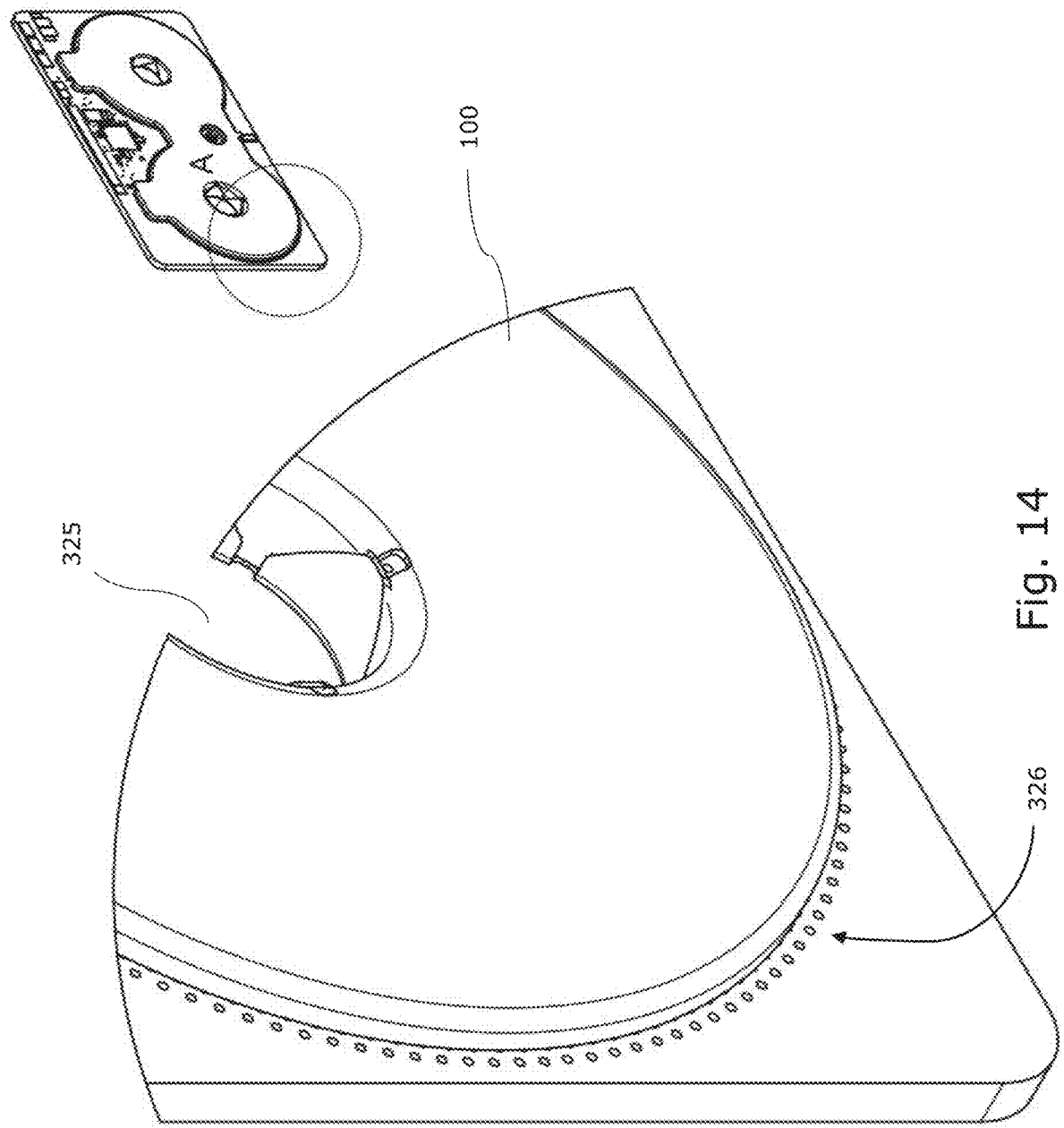
FIG. 14 shows an example view of the electrostatic shield of FIG. 3 combined with the current sensing device of FIG. 10.

When the electrostatic shield 100 is used in combination with the current sensing device 300, the electrostatic shield vias 326 may be beneath the electrostatic shield 100, outside of the electrostatic shield 100, or part beneath and part outside the electrostatic shield, as represented in FIG. 14.

The invention claimed is:

1. An electrostatic shield for use with a current sensing coil, the current sensing coil having a primary plane and a substantially central opening arranged to receive a current carrying conductor through the opening and through the primary plane, the electrostatic shield comprising:
   a first shield body for mounting over a first side of the current sensing coil, the first shield body comprising:
      a first primary shield portion configured to extend substantially in a direction of the primary plane of the current sensing coil when the first shield body is mounted over the first side of the current sensing coil; and
      a first core shield portion extending transversely to the first primary shield portion and configured to extend at least partially through the central opening of the current sensing coil from a first side of the current sensing coil when the first shield body is mounted over the first side of the current sensing coil; and
   a second shield body for mounting over a second side of the current sensing coil, the second shield body comprising:
      a second primary shield portion configured to extend substantially in a direction of the primary plane of the current sensing coil when the second shield body is mounted over the second side of the current sensing coil; and
      a second core shield portion extending transversely to the second primary shield portion and configured to extend at least partially through the central opening of the current sensing coil from a second side of the current sensing coil when the second shield body is mounted over the second side of the current sensing coil,
   wherein the first core shield portion and second core shield portion together define a core shield extending into the central opening of the current sensing coil to shield at least a part of the current sensing coil from electrostatic coupling when the first shield body is mounted over the first side of the current sensing coil and the second shield body is mounted over the second side of the current sensing coil.

2. The electrostatic shield of claim 1, wherein the first and second core shield portions are sized to at least partially overlap when the first shield body is mounted over the first side of the current sensing coil and the second shield body is mounted over the second side of the current sensing coil.

3. The electrostatic shield of claim 1, wherein the first core shield portion comprises a plurality of first core projections, and wherein the second core shield portion comprises a plurality of second core projections.

4. The electrostatic shield of claim 3, wherein the plurality of first core projections are arranged in a first array and the plurality of second core projections are arranged in a second array, wherein the first and second arrays correspond to the shape of the substantially central opening of the current sensing coil with a gap between adjacent core projections.

5. The electrostatic shield of claim 4, wherein the arrays of the first and second core shield portions are arranged such that, when the first shield body is mounted over the first side of the current sensing coil and the second shield body is mounted over the second side of the current sensing coil, the gaps between adjacent core projections in the first array of the first core shield portion are at least partially aligned with the core projections of the second array of the second core shield portion, and the gaps between adjacent second core projections in the second array of the second core shield portion are at least partially aligned with the first core projections of the first array of the first core shield portion.

6. The electrostatic shield of claim 4, wherein a diameter of the first array of first core projections is smaller than a diameter of the second array of second core projections.

7. The electrostatic shield of claim 6, wherein at least part of the first core projections overlap with at least part of the second core projections.

8. The electrostatic shield of claim 1, further configured for use with a further current sensing coil, the further current sensing coil having the same primary plane as the current sensing coil and a further substantially central opening arranged to receive a further current carrying conductor through the further substantially central opening and through the primary plane,
   wherein the first shield body further comprises a first further core shield portion extending transversely to the first primary shield portion and configured to extend at least partially through the further substantially central opening of the further current sensing coil from a first side of the further current sensing coil when the first shield body is mounted over the first side of the current sensing coil,
   wherein the second shield body further comprises a second further core shield portion extending transversely to the second primary shield portion and configured to extend at least partially through the further substantially central opening of the further current sensing coil from a second side of the further current sensing coil when the second shield body is mounted over the second side of the current sensing coil, and
   wherein the first further core shield portion and second further core shield portion together define a further core shield extending into the central opening of the further current sensing coil to shield at least a part of the further current sensing coil from electrostatic coupling when the first shield body is mounted over the first side of the current sensing coil and the second shield body is mounted over the second side of the current sensing coil.

9. The electrostatic shield of claim 8, wherein a diameter of the first core shield portion is smaller than a diameter of the first further core shield portion, and wherein a diameter of the second core shield portion is smaller than a diameter of the second further core shield portion.

10. A shielded current sensing device assembly comprising:
   a current sensing device comprising a board having a first board surface and an opposing second board surface, an opening in the board for receiving a current carrying conductor through the board, and a current sensing coil formed on the board and arranged around at least part of the opening; and
   an electrostatic shield comprising:
     a first shield body mounted on the first board surface and comprising:
       a first primary shield portion extending substantially in a direction of the first surface of the current sensing coil to provide electrostatic shielding to the current sensing coil at the first board surface; and
       a first core shield portion extending transversely to the first primary shield portion and extending at least partially through the opening from a first side of the current sensing coil; and
     a second shield body mounted on the second board surface and comprising:
       a second primary shield portion extending substantially in a direction of the second surface of the current sensing coil to provide electrostatic shielding to the current sensing coil at the second board surface; and
       a second core shield portion extending transversely to the second primary shield portion and extending at least partially through the opening from a second side of the current sensing coil;
     wherein the first core shield portion and second core shield portion together define a core shield extending into the opening to shield at least a part of the current sensing coil from electrostatic coupling.

11. The shielded current sensing device assembly of claim 10, wherein the board is a printed circuit board.

12. An electrostatic shield for use with a current sensing coil, the current sensing coil having a primary plane and a substantially central opening arranged to receive a current carrying conductor through the opening and through the primary plane, the electrostatic shield comprising:
   a shield body comprising:
     a primary shield portion configured to extend substantially in a direction of the primary plane of the current sensing coil when the shield body is in use; and
     a core shield portion configured to extend at least partially through the central opening of the current sensing coil to shield at least a part of the current sensing coil from electrostatic coupling when the shield body is in use.

13. The electrostatic shield of claim 12, wherein each of the core projections comprises a base connection to the primary shield portion and a tip distal from the base, wherein the tip is narrower than the base connection.

14. The electrostatic shield of claim 12, wherein the primary shield body and the core shield portion are formed from a single sheet of material.

15. The electrostatic shield of claim 12, wherein the primary shield portion has a primary plane arranged to extend substantially in a direction of the primary plane of the current sensing coil.

16. The electrostatic shield of claim 12, wherein the core shield portion is arranged to correspond to a shape of the substantially central opening of the current sensing coil.

17. The electrostatic shield of claim 16, wherein the core shield portion has a substantially circular or cylindrical shape.

18. The electrostatic shield of claim 12, wherein at least some of the surfaces of the shield body are metallic.

19. The electrostatic shield of claim 18, wherein the shield body comprises a nickel coating.

20. The electrostatic shield of claim 12, wherein the core shield portion comprises a plurality of core projections extending transversely to the primary shield portion, and wherein each of the plurality of core projections is formed from a bent portion of the primary shield portion.

21. The electrostatic shield of claim 20, wherein the plurality of core projections are arranged in an array so as to provide a gap between adjacent core projections in the array.

* * * * *